(12) United States Patent
Figueredo et al.

(10) Patent No.: US 11,018,651 B2
(45) Date of Patent: May 25, 2021

(54) BULK ACOUSTIC WAVE RESONATORS HAVING DOPED PIEZOELECTRIC MATERIAL AND AN ADHESION AND DIFFUSION BARRIER LAYER

(71) Applicant: Avago Technologies International Sales Pte. Limited, Singapore (SG)

(72) Inventors: Domingo Figueredo, Fernandina Beach, FL (US); Hans G. Rohdin, Los Altos, CA (US); Brice Ivira, San Jose, CA (US); Alexia Kekoa, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 521 days.

(21) Appl. No.: 15/956,814

(22) Filed: Apr. 19, 2018

(65) Prior Publication Data

US 2019/0326880 A1    Oct. 24, 2019

(51) Int. Cl.
| | |
|---|---|
| *H03H 9/13* | (2006.01) |
| *H03H 9/02* | (2006.01) |
| *H03H 9/56* | (2006.01) |
| *H03H 9/17* | (2006.01) |
| *H01L 41/047* | (2006.01) |

(52) U.S. Cl.
CPC ........ *H03H 9/131* (2013.01); *H03H 9/02015* (2013.01); *H03H 9/175* (2013.01); *H03H 9/564* (2013.01); *H01L 41/0477* (2013.01); *H03H 9/568* (2013.01)

(58) Field of Classification Search
CPC ..... H03H 9/131; H03H 9/02015; H03H 9/175
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 5,910,756 A | 6/1999 | Ella |
| 6,060,818 A | 5/2000 | Ruby et al. |
| 6,107,721 A | 8/2000 | Lakin |
| 6,262,637 B1 | 7/2001 | Bradley et al. |
| 6,507,983 B1 | 1/2003 | Ruby et al. |
| 6,828,713 B2 | 12/2004 | Bradley et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,369,013 B2 | 5/2008 | Fazzio et al. |
| 7,388,454 B2 | 6/2008 | Ruby et al. |
| 7,561,009 B2 | 7/2009 | Larson, III et al. |
| 7,629,865 B2 | 12/2009 | Ruby |
| 7,714,684 B2 | 5/2010 | Ruby et al. |

(Continued)

*Primary Examiner* — Derek J Rosenau
(74) *Attorney, Agent, or Firm* — Foley & Lardner LLP

(57) ABSTRACT

Bulk acoustic wave (BAW) resonators, and electrical filters that incorporate the BAW resonators, are described. Generally, the BAW resonators comprise a substrate comprising an acoustic reflector; a first electrode disposed over the acoustic reflector; a piezoelectric layer disposed over the first electrode, the piezoelectric layer comprising scandium-doped aluminum nitride (ASN); a diffusion barrier layer disposed over the piezoelectric layer; and a second electrode disposed over the diffusion barrier layer. The diffusion barrier layer configured to prevent diffusion of material of the first electrode into the piezoelectric layer.

24 Claims, 6 Drawing Sheets

(56) References Cited

U.S. PATENT DOCUMENTS

| | | |
|---|---|---|
| 7,791,434 B2 | 9/2010 | Fazzio et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,390,397 B2 | 3/2013 | Jamneala et al. |
| 8,436,516 B2 | 5/2013 | Ruby et al. |
| 8,673,121 B2 | 3/2014 | Larson, III et al. |
| 8,902,023 B2 | 12/2014 | Choy et al. |
| 8,981,876 B2 | 3/2015 | Jamneala et al. |
| 9,088,265 B2 | 7/2015 | Bradley et al. |
| 9,136,819 B2 | 9/2015 | Grannen et al. |
| 9,197,185 B2 | 11/2015 | Zou et al. |
| 9,243,316 B2 | 1/2016 | Larson, III et al. |
| 9,401,691 B2 | 7/2016 | Zou et al. |
| 9,444,428 B2 | 9/2016 | Ruby et al. |
| 9,450,167 B2 | 9/2016 | Zou et al. |
| 9,455,681 B2 | 9/2016 | Feng et al. |
| 9,479,139 B2 | 10/2016 | Ruby et al. |
| 9,484,882 B2 | 11/2016 | Burak et al. |
| 9,490,418 B2 | 11/2016 | Burak et al. |
| 9,520,855 B2 | 12/2016 | Feng et al. |
| 9,525,397 B2 | 12/2016 | Burak |
| 9,548,438 B2 | 1/2017 | Burak et al. |
| 9,564,553 B2 | 2/2017 | Katona et al. |
| 9,571,063 B2 | 2/2017 | Burak et al. |
| 9,571,064 B2 | 2/2017 | Burak et al. |
| 9,577,603 B2 | 2/2017 | Burak et al. |
| 9,590,165 B2 | 3/2017 | Zou et al. |
| 9,602,073 B2 | 3/2017 | Grannen et al. |
| 9,608,592 B2 | 3/2017 | Bi et al. |
| 9,608,594 B2 | 3/2017 | Burak et al. |
| 9,621,126 B2 | 4/2017 | Burak et al. |
| 9,667,220 B2 | 5/2017 | Sridaran et al. |
| 9,679,765 B2 | 6/2017 | Larson, III et al. |
| 9,680,439 B2 | 6/2017 | Nikkel et al. |
| 9,680,445 B2 | 6/2017 | Barfknecht et al. |
| 9,691,963 B2 | 6/2017 | Burak |
| 9,698,753 B2 | 7/2017 | Burak |
| 9,698,754 B2 | 7/2017 | Burak |
| 9,634,642 B2 | 8/2017 | Burak et al. |
| 9,748,918 B2 | 8/2017 | Burak et al. |
| 9,768,353 B2 | 9/2017 | Katona et al. |
| 9,917,567 B2 | 3/2018 | Bradley et al. |
| 2005/0253904 A1* | 11/2005 | Miyazawa ............ B41J 2/14233 347/68 |
| 2012/0326807 A1 | 12/2012 | Choy et al. |
| 2013/0015747 A1 | 1/2013 | Ruby et al. |
| 2013/0250520 A1* | 9/2013 | Taniguchi ............. F28F 21/089 361/707 |
| 2014/0132117 A1 | 5/2014 | Larson, III |
| 2014/0174908 A1 | 6/2014 | Feng et al. |
| 2014/0246305 A1 | 9/2014 | Larson, III |
| 2015/0145610 A1 | 5/2015 | Ruby et al. |
| 2015/0240349 A1 | 8/2015 | Grannen et al. |
| 2015/0247232 A1 | 9/2015 | Nikkel et al. |
| 2015/0280687 A1 | 10/2015 | Burak et al. |
| 2015/0280688 A1 | 10/2015 | Ortiz et al. |
| 2015/0311046 A1 | 10/2015 | Yeh et al. |
| 2015/0326200 A1 | 11/2015 | Grannen et al. |
| 2015/0349745 A1 | 12/2015 | Small |
| 2016/0079958 A1 | 3/2016 | Burak |
| 2016/0126930 A1 | 5/2016 | Zou et al. |
| 2016/0191015 A1 | 6/2016 | Ivira et al. |
| 2016/0308509 A1 | 10/2016 | Burak et al. |
| 2016/0352306 A1 | 12/2016 | Bradley et al. |
| 2016/0352308 A1 | 12/2016 | Ivira et al. |
| 2017/0047907 A1 | 2/2017 | Burak et al. |
| 2017/0085247 A1 | 3/2017 | Ruby et al. |
| 2017/0155373 A1 | 6/2017 | Ruby et al. |
| 2017/0214387 A1 | 7/2017 | Burak et al. |
| 2017/0288121 A1 | 10/2017 | Burak et al. |
| 2017/0288122 A1* | 10/2017 | Zou ........................ H03H 9/173 |
| 2017/0288628 A1 | 10/2017 | Grannen et al. |
| 2017/0288636 A1 | 10/2017 | Zou et al. |
| 2017/0338799 A1 | 11/2017 | Ruby et al. |

* cited by examiner

BULK ACOUSTIC WAVE RESONATORS HAVING DOPED PIEZOELECTRIC MATERIAL AND AN ADHESION AND DIFFUSION BARRIER LAYER

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), solidly mounted resonators (SMRs), coupled resonator filters (CRFs), stacked bulk acoustic resonators (SBARs) and double bulk acoustic resonators (DBARs).

A typical acoustic resonator comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

One metric used to evaluate the performance of an acoustic resonator is its electromechanical coupling coefficient ($kt^2$), which indicates the efficiency of energy transfer between the electrodes and the piezoelectric material. Other things being equal, an acoustic resonator with higher $kt^2$ is generally considered to have superior performance to an acoustic resonator with lower $kt^2$. Accordingly, it is generally desirable to use acoustic resonators with higher levels of $kt^2$ in high performance wireless applications, such as 4G and LTE applications.

The $kt^2$ of an acoustic resonator is influenced by several factors, such as the dimensions, composition, and structural properties of the piezoelectric material and electrodes. These factors, in turn, are influenced by the materials and manufacturing processes used to produce the acoustic resonator. Consequently, in an ongoing effort to produce acoustic resonators with higher levels of $kt^2$, researchers are seeking improved approaches to the design and manufacture of acoustic resonators.

One method that is useful in improving the $kt^2$ of piezoelectric materials is by doping the piezoelectric material with a selected dopant, such as a rare-earth element. While doping the piezoelectric material can provide improvement in $kt^2$, as power demands on devices (e.g., electrical filters) that include BAW resonators comprising doped piezoelectric layers increase, diffusion of material from the electrodes of the BAW resonators can result in the formation of voids or defects in the piezoelectric layer. These voids can degrade the acoustic properties of the piezoelectric layer, and the ultimately the electrical performance of the BAW resonators.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
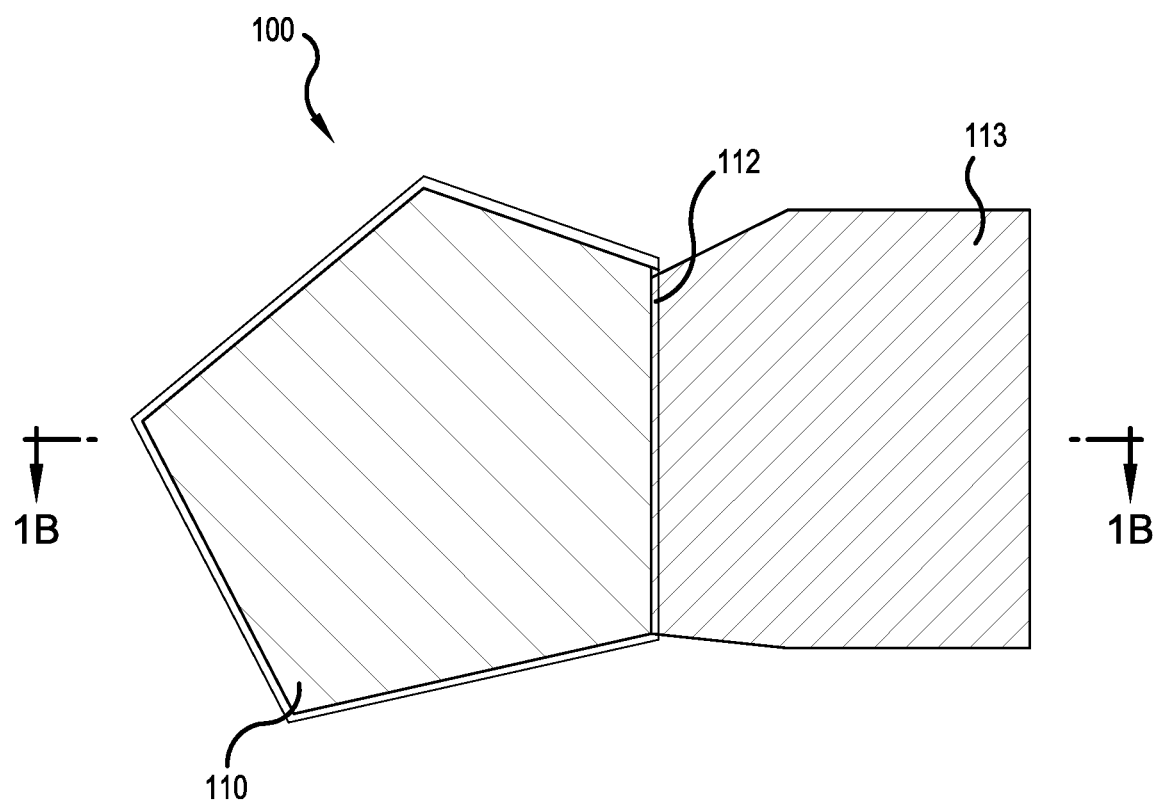
FIG. 1A is a top view of a BAW resonator in accordance with a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "beneath," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

A variety of devices, structures thereof, materials and methods of fabrication are contemplated for the BAW resonators of the present teachings. Various details of such FBAR and SMR devices contemplated for use as the BAW resonators of the present teachings, and corresponding methods of fabrication may be found, for example, in one or more of the following U.S. patent documents: U.S. Pat. No. 6,107,721, to Lakin; U.S. Pat. Nos. 5,587,620, 5,873,153, 6,507,983, 7,388,454, 7,629,865, 7,714,684, 8,436,516, 9,479,139, 9,444,428, 6,060,818, 6,060,818C1 (Ex Parte Reexamination Certificate) and U.S. Patent Application Publication Nos. 20130015747, 20170155373, 20170085247 and 20150145610 to Ruby et al. U.S. Pat. Nos. 7,369,013, 7,791,434, 8,188,810, and 8,230,562 to Fazzio, et al.; U.S. Pat. Nos. 7,280,007, 9,455,681 and 9,520,855 and U.S. Patent Application Publication No. 20140174908 to Feng et al.; U.S. Pat. Nos. 8,248,185 and 8,902,023 and U.S. Patent Application Publication No. 20120326807 to Choy, et al.; U.S. Pat. Nos. 7,345,410, 9,136,819 and 9,602,073 and U.S. Patent Application Publication Nos. 20170288628, 20150326200 and 20150240349 to Grannen, et al.; U.S. Pat. Nos. 6,828,713 and 9,088,265 and U.S. Patent Application Publication No. 20160352306 and U.S. Pat. No. 9,917,567 to Bradley, et al.; U.S. Pat. Nos. 7,561,009, 7,358,831, 8,673,121, 9,243,316, and 9,679,765 and U.S. Patent Application Publication No. 20140246305 to Larson, III et al.; U.S. Pat. Nos. 9,197,185, 9,450,167, 9,590,165, 9,401,691 and 9,590,165 and U.S. Patent Application Publication Nos. 20170288636, 20170288122 and 20160126930 to Zou, et al.; U.S. Pat. Nos. 8,981,876, and 8,390,397 to Jamneala et al.; U.S. Pat. Nos. 9,484,882, 9,571,063, 9,621,126, 9,691,963, 9,698, 754, 9,608,594, 9,634,642, 9,548,438, 9,698,753, 9,577,603, 9,525,397, 9,748,918, 9,484,882, 9,571,064, 9,490,418, and 9,634,642, and U.S. Patent Application Publication Nos. 20170288121, 20170214387, 20170047907, 20160308509, 20160079958 and 20150280687 to Burak, et al.; U.S. Pat. Nos. 9,768,353 and 9,564,553 to Katona, et al.; U.S. Patent Application Publication Nos. 20160352308 and 20160191015 to Ivira, et al.; U.S. Pat. No. 9,680,445 to Barfknecht, et al.; U.S. Patent Application Publication No. 20150349745 to Small; U.S. Patent Application Publication No. 20150311046 to Yeh, et al.; U.S. Patent Application Publication No. 20150280688 to Ortiz, et al.; U.S. Pat. No. 9,680,439 and U.S. Patent Application Publication No. 20150247232 to Nikkel, et al.; U.S. Pat. No. 9,667,220 to Sridaran, et al.; U.S. Pat. No. 9,608,592 to Bi, et al.; and U.S. patent application Ser. No. 15/661,468 to Ruby, et al., and filed on Jun. 27, 2017. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

The described representative embodiments relate generally to bulk acoustic wave (BAW) resonators, and electrical filters that incorporate the BAW resonators. Generally, the BAW resonators comprise a substrate comprising an acoustic reflector; a first electrode disposed over the acoustic reflector; a piezoelectric layer disposed over the first electrode, the piezoelectric layer comprising scandium-doped aluminum nitride (ASN); a diffusion barrier layer disposed over the piezoelectric layer; and a second electrode disposed over the diffusion barrier layer. The diffusion barrier layer configured to prevent diffusion of material of the first electrode into the piezoelectric layer.

In certain representative embodiments, another diffusion barrier layer is disposed between the first electrode and the piezoelectric layer. In some representative embodiments the diffusion barrier layer(s) comprise a single material. In other representative embodiments, the diffusion barrier layer(s) comprise two materials. These embodiments with a two-material diffusion barrier layer can comprise a two-material compound, and in other embodiments a two-layer diffusion barrier can be provided with one material as the first layer, and the second material as the second layer.

Notably, and as described more fully below, the diffusion barrier layers of representative embodiments comprise an adhesive component. In certain embodiments the adhesive component is titanium (Ti).

Similarly, and as described more fully below, the diffusion barrier layers of representative embodiments comprise a diffusion barrier component. In certain representative embodiments, the diffusion barrier component comprises one of nitrogen (N), oxygen (O), and tungsten (W).

FIG. 1A is a top view of a BAW resonator 100 in accordance with a representative embodiment. The BAW resonator 100 comprises an upper electrode 110 (referred to below as second electrode 110) illustratively having five (5) sides, with a connection side 112 configured to provide an electrical connection to interconnect 113. The interconnect 113 provides electrical signals to the upper electrode 110 to excite desired acoustic waves in a piezoelectric layer (not shown in FIG. 1) of the BAW resonator 100. Notably, an airbridge (not shown), such as described in above incorporated U.S. Pat. No. 8,248,185 may be provided at the connection side 112, and cantilevered portions (not shown), such as described in above-incorporated U.S. Pat. No. 8,902,023 may be provided on one or more of the sides, other than the connection side 112. Notably, the configuration of the structure depicted in FIG. 1A is merely illustrative, and many other configurations such as described in the above-incorporated patents and patent application publications are contemplated for use in connection with the BAW resonators of the present teachings.

Figure 1B:
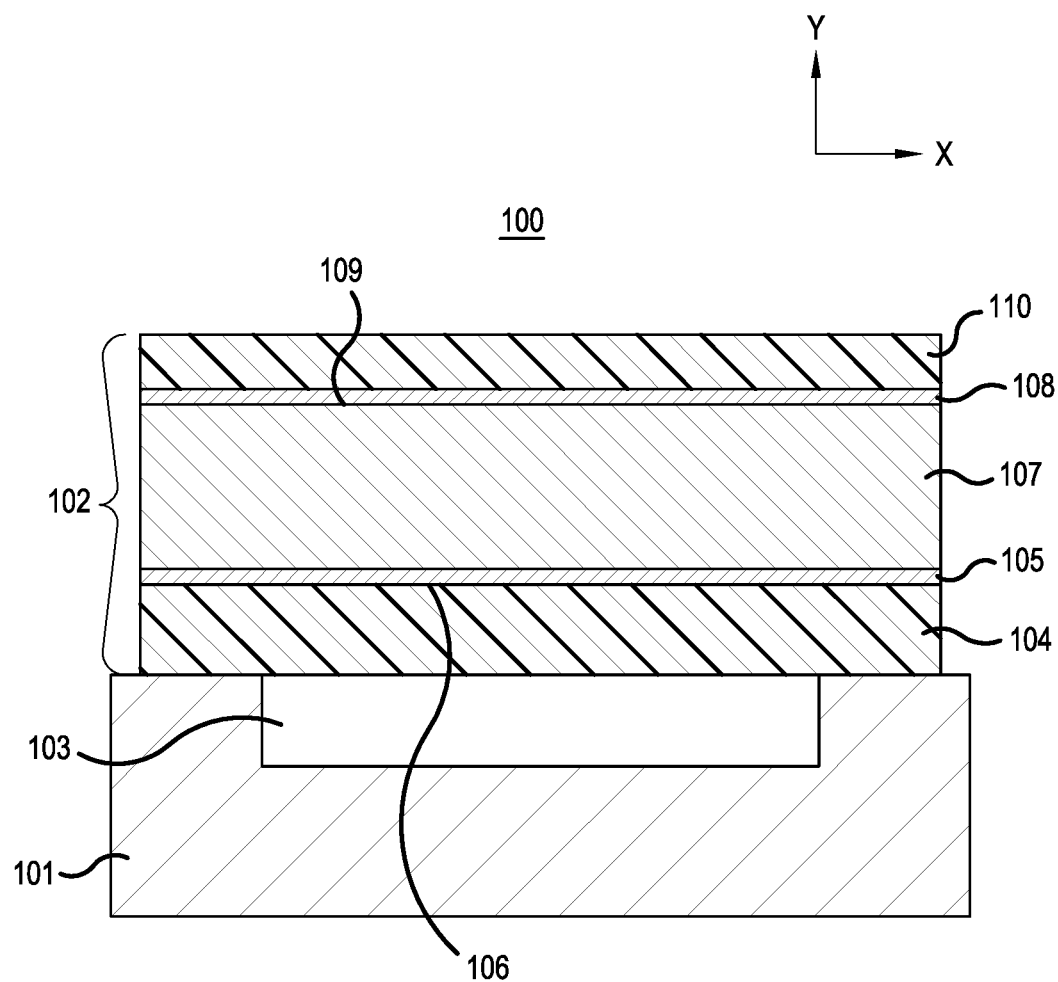
FIG. 1B is a cross-sectional view of a BAW resonator according to a representative embodiment.

FIG. 1B is a cross-sectional view of BAW resonator 100 along the line 1B-1B, according to a representative embodiment. The BAW resonator 100 comprises a substrate 101, with an acoustic stack 102 disposed over a reflective element 103, which, in the present representative embodiment, is a cavity provided in the substrate 101. The acoustic stack comprises: a first electrode 104 disposed over the substrate 101; a first diffusion barrier layer 105 disposed over an upper surface 106 of the first electrode 104; a piezoelectric layer 107 is disposed over the first diffusion barrier layer 105; and a second diffusion barrier layer 108 is disposed over an upper surface 109 of the piezoelectric layer 107; and a second electrode 110 is disposed over the second diffusion barrier layer 108.

As described in certain patents and patent application publications incorporated by reference above, an overlap of the acoustic stack 102 with the reflective element 103 is referred to as the active area. Moreover, when the reflective element 103 is a cavity or void beneath the first electrode, the BAW resonator 100 is often referred to as an FBAR. By contrast, as described below, the reflective element 103 may comprise a Bragg reflector, which comprises alternating layers of high acoustic impedance material and low acoustic impedance material. When the reflective element 103 comprises a Bragg reflector, the BAW resonator 100 is often referred to as an SMR.

In representative embodiments, the first and second electrodes illustratively comprise molybdenum (Mo), and the substrate 101 comprises silicon (Si). These materials are merely illustrative, and it is emphasized that other materials, such as disclosed in the above-incorporated patents and patent application publications, are contemplated.

The piezoelectric layer 107 comprises a highly-textured, doped piezoelectric material, and may be formed using a known method, such as described in above-incorporated U.S. Pat. Nos. 9,455,681, 9,679,765 and U.S. Patent Publication 20140132117. Piezoelectric layer 107 comprises a thin film piezoelectric comprising $Al_{1-x}Sc_xN$. In some embodiments, piezoelectric layer 107 are formed on a seed layer (not shown) disposed over respective upper surfaces of first and second electrodes 104, 110. The seed layer may comprise Al, for instance, to foster growth of $Al_{1-x}Sc_xN$.

As indicated above, the use of $Al_{1-x}Sc_xN$ in this manner allows BAW resonator 100 to achieve the benefits typically associated with a BAW resonator while avoiding or compensating for the corresponding drawbacks, such as decreased piezoelectric coupling coefficient and Q factor, and increased insertion loss, and an unacceptably thick piezoelectric layer.

Piezoelectric layer 107 is typically formed by a sputtering process using one or more scandium-doped aluminum sputtering targets in an atmosphere comprising at least nitrogen gas, typically in combination with one or more inert gases such as argon. The sputtering targets are typically doped with a percentage of scandium atoms corresponding to a desired composition of piezoelectric layer 107. For instance, in some embodiments, a sputtering target may be doped with approximately 3.0 to 40.0 percent scandium atoms to produce a piezoelectric layer of $Al_{1-x}Sc_xN$ where x is between approximately 0.03 and 0.40. Again, further details of sputtering from a target are found, for example, in U.S. Patent Application Publication No. 20140132117, and U.S. Pat. No. 9,679,765 to Larson III, et al.

When percentages of doping elements in a piezoelectric layer, it is in reference to the total atoms of the piezoelectric layer. Notably, when the percentages of doping elements (e.g., Sc) in a doped AlN layer are discussed herein, it is in reference to the total atoms (not including nitrogen) of the AlN piezoelectric layer. So, for example, and as described for example in U.S. Patent Application Publication No. 20140132117, if the Sc in the piezoelectric layer of a representative embodiment has an atomic percentage of approximately 5.0%, and the Al has an atomic percentage of approximately 95.0%, then the atomic consistency of the piezoelectric layer may then be represented as $Al_{0.95}Sc_{0.05}N$.

Various embodiments relate to providing a thin film of piezoelectric material (e.g., piezoelectric layer 107), with an enhanced piezoelectric coefficient $d_{33}$ and an enhanced electromechanical coupling coefficient $kt^2$ by incorporating one or more rare earth elements into the crystal lattice of a portion of the piezoelectric layer. By incorporating specific atomic percentages of the multiple rare earth elements, the piezoelectric properties of the piezoelectric material, including piezoelectric coefficient $d_{33}$ and enhanced electromechanical effective coupling coefficient $kt^2$, are improved as compared to the same piezoelectric material that is entirely stoichiometric (undoped).

In accordance with a representative embodiment, the piezoelectric layer 107 comprises AlN material doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material. As such, electric dipoles of the piezoelectric material of piezoelectric layer 107 are altered in such a way that an electrical field produces a comparatively strong mechanical response of the dipoles, resulting in a higher $kt^2$. As noted above, the atomic percentage of scandium in the aluminum nitride layer (i.e., the atomic percent of Sc in Sc—Al inside the Al—Sc—N material) is approximately 3.0% to approximately 40.0%; and in other representative embodiments, the percentage of scandium in an aluminum nitride layer is approximately greater than approximately 5.0% to approximately 40.0%

Alternatively, a number of Al atoms within the AlN crystal lattice may be replaced with other rare earth element(s) at predetermined percentages. The rare earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein. Because the doping elements replace only Al atoms in the AlN crystal, the percentage of nitrogen atoms in the piezoelectric material remains substantially the same regardless of the amount of doping. As such, and as noted above, when percentages of doping elements are discussed herein, it is in reference to the total atoms (not including nitrogen) of the AlN piezoelectric material.

In other representative embodiments, the piezoelectric layer 107 is not doped. Notably, and as described in above-incorporated U.S. Pat. No. 9,917,567, in certain comparatively high-frequency applications, the thickness of the acoustic stack 102, including piezoelectric layer 107, which is undoped in this illustrative example, is comparatively thin. In known BAW resonators a thin acoustic stack results in comparatively high electric fields under high power. Because the acoustic stack of the known BAW resonator is comparative thin, the thermal conductance from the center of the active area to the outer edges thereof is increased. As such, the heat carrying capacity of the known BAW resonator would be reduced creating a situation where the BAW known BAW resonator reaches a comparatively high operating temperature. Under high temperature, the structural integrity of the known BAW resonator, including include the interface between the piezoelectric layer and the top and bottom electrodes, would be further stressed. Ultimately, in known BAW resonators, delamination can occur between piezoelectric layer and the top and bottom electrodes. By contrast, and as described more fully herein, first diffusion barrier layer 105 and second diffusion barrier layer 108, in addition to increasing the interface adhesion/integrity respective first and second electrodes 104, 110, beneficially provide an excellent diffusion barrier as described herein.

As noted above, as power requirements for BAW resonators increase, in certain known BAW resonators, diffusion of electrode material into the piezoelectric layer can create voids in the piezoelectric layer. These voids, which are in bulk defects in the crystalline structure of the piezoelectric layer, can have a deleterious impact on desired characteristics of the piezoelectric material, and on BAW resonators comprising such piezoelectric material. Stated somewhat differently, the piezoelectric layer is highly textured. The highly textured piezoelectric layer beneficially fosters good acoustic properties in the material, which result in good acoustic and electrical performance of the BAW resonator, and electrical devices (e.g., filters) incorporating the BAW resonator. The occurrence of voids resulting from diffusion of material from the electrode(s) (e.g., Mo) disturbs the highly-ordered crystalline structure of the piezoelectric layer. As will be appreciated by one of ordinary skill in the art, these voids (bulk defects) can result in significant variation of the acoustic coupling coefficient ($kt^2$) doped piezoelectric layer, where this variation increases with increasing occurrence of bulk defects. Similarly, other parameters, such as the resistance at parallel resonance ($R_p$) and the overall quality factors of BAW resonators made from such a wafer can vary significantly as well. As can be appreciated, such variability of material and device parameters across a wafer comprising many BAW resonators is unacceptable.

Without wishing to be bound by theory, the Applicants believe is that under high electrical power operation, and without the first diffusion barrier layer 105, the structural integrity of the BAW resonator 100, and more specifically the interface between the first electrode 104, and the piezoelectric layer 107 may delaminate ('unzip') at the interface of the first electrode 104 (e.g., Mo) and the piezoelectric layer 107 (e.g., ASN). Alternatively, and again without wishing to be bound by theory, Applicants hypothesize that with the higher scandium content in the ASN piezoelectric layers of more recent BAW resonators, and the columnar nature of the ASN growth, are local inhomogeneities (perhaps along grain boundaries) which permit a low temperature ternary alloy to form and result in the melting, sputtering and migration of material (e.g., Mo) from an electrode into the piezoelectric layer (e.g., ASN).

Applicants have discovered that by providing the first diffusion barrier layer 105 over the upper surface 106 of the first electrode 104, the incidence of diffusion of material from the first electrode 104 into the piezoelectric layer 107 is significantly curbed. This results in suppression of the noted bulk defects in the resultant piezoelectric layer, and a more uniform piezoelectric layer 107 with fewer incidents of clustering of voids cause by diffusing electrode material (e.g., Mo). Beneficially, by preventing the formation of voids in the piezoelectric layer 107 by the present teachings, the desired crystalline nature of the highly textured piezoelectric layer 107, and the attendant benefits in acoustic and electrical performance of the BAW resonator 100 are realized.

Notably, the addition of any layer to the acoustic stack 102 of the BAW resonator 100 can impact the acoustic properties, and acoustic and electric performance of the BAW resonator. Accordingly, the material selected for the first diffusion barrier layer 105 is selected to have compatible acoustic properties with other layers in the acoustic stack 102 of the BAW resonator so as to avoid as much as possible undesired impact on the function of the acoustic stack 102. As such, providing a suitably benign first diffusion barrier layer 105 includes selection of not only a material having suitable acoustic properties such as acoustic propagation velocity, and acoustic impedance. In accordance with a representative embodiment, the material selected for the first diffusion barrier layer 105 has an acoustic velocity is in the range of approximately from 1.2 mm/s to approximately 6.5 mm/s. In accordance with a representative embodiment, the material selected for the first diffusion barrier layer 105 is in the range of approximately 17 MRayl to approximately 101 MRayl. Notably, however, even in the case where the barrier material(s) selected for the first diffusion barrier layer does not possess optimal acoustic properties, the negative impact to the overall acoustic performance of the stack can be mitigating by using a thin layer of the barrier material. In some representative embodiments, the first diffusion barrier layer 105 has a thickness in the range of approximately 10 Å to approximately 25 Å. Even such a comparatively thin first diffusion barrier layer 105 selected from certain illustrative materials described below, provide acceptable adhesion and diffusion-barrier properties. More generally, so as to not adversely impact the acoustic properties of the acoustic stack 102, the first diffusion barrier layer 105 is generally comparatively thin (y-dimension in the coordinate system of FIG. 1B). Illustratively, in certain representative embodiments, the first diffusion barrier layer 105 has a thickness in the range of approximately 10 Å to approximately 100 Å. In other representative embodiments, the first diffusion barrier layer 105 has a thickness in the range of approximately 10 Å to approximately 500 Å.

In certain embodiments, the first diffusion barrier layer 105 is a single material. In other representative embodiments, the first diffusion barrier layer 105 comprises two materials. In some representative embodiments, the two materials form a single layer comprising a compound of the two materials, and in other representative embodiments, the first diffusion barrier layer comprises a first layer of the first material, and a second layer of the second material.

In accordance with a representative embodiment, the first diffusion barrier layer 105 comprises titanium (Ti). As will be appreciated by one of ordinary skill in the art, elemental titanium provides adequate adhesive properties, and thereby provides good adhesion of the first electrode 104 to the piezoelectric layer 107.

In accordance with another representative embodiment, the first diffusion barrier layer 105 comprises titanium nitride (TiN) or titanium oxide (TiO). In addition to providing good adhesion, and a sufficient elastic modulus, these materials are superior diffusion barrier.

In accordance with another representative embodiment, the first diffusion barrier layer 105 comprises a substantially uniform binary layer (i.e., compound) of titanium and tungsten (i.e., TiW). As will be appreciated, in addition to providing good adhesion, and a sufficient acoustic and electrical conductance, titanium and tungsten provide superior diffusion barriers to the acoustic stack 102 of the BAW resonator 100. As will be appreciated, in addition to providing good adhesion, and a sufficient acoustic and electrical conductance, titanium and tungsten provide superior diffusion barriers to the acoustic stack 102 of the BAW resonator 100. In accordance with a representative embodiment, the second diffusion barrier layer 108 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 102, with the presence of titanium (Ti) in the tungsten (W) matrix of the alloy providing a good barrier layer as well.

In accordance with another representative embodiment, the first diffusion barrier layer 105 comprises a layer of titanium (Ti) and a layer of platinum (Pt). In some embodiments, the titanium layer is disposed between the piezoelectric layer 107 and the platinum layer; and in other embodiments, the platinum layer is disposed between the piezoelectric layer 107 and the titanium. As noted above, titanium provides beneficial adhesion to aid in preventing delamination as described above, and platinum provides a beneficial diffusion barrier. As such, in addition to providing good adhesion, and a sufficient acoustic and electrical conductance, titanium and platinum provide superior diffusion barriers.

As noted above, in certain representative embodiments, the first diffusion barrier layer 105 has a thickness in the range of approximately 10 Å to approximately 100 Å; and in other representative embodiments, the first diffusion barrier layer 105 has a thickness in the range of approximately 10 Å to approximately 500 Å. In representative embodiments including a bi-layer first diffusion barrier layer 105, the Ti layer is disposed by a known method first over the first electrode 104, and the Pt layer is disposed by a known method over the Ti layer, and beneath the piezoelectric layer 107. In accordance with a representative embodiment, the titanium layer has a thickness of approximately 10 Å, and the platinum layer thickness of approximately 500 Å

In another representative embodiment, the first diffusion barrier layer 105 is platinum (Pt). In addition to providing suitable adhesive and diffusive barrier properties, and as will be explained more fully below with the description of a second diffusion barrier layer 108, platinum has been found to 'smooth' the surface of the piezoelectric layer 107, which is in direct contact with upper surface 106. This smoothing, in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interface to a uniform depth roughly twice that of the deposited platinum (Pt). When applied to the chemically similar piezoelectric material, which is also a material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface.

In certain representative embodiments, and as will be readily apparent to one of ordinary skill in the art, an etching step using a known etchant (e.g., HF) is used, for example, to form the cavity, of the BAW resonator 100. Applicants have found that subjecting the diffusion barrier layers (e.g., first diffusion barrier layer 105) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the first diffusion barrier layer 105 over the upper surface 106 of the piezoelectric layer 107, the acoustic coupling coefficient ($kt^2$), and its attendant parameters, resistance at parallel resonance (Rp), and resistance at series resonance (Rs) are at least acceptable to the performance requirements of the BAW resonator 100. Similarly, the overall Q of the device is at least acceptable.

As depicted in FIG. 1B, the second diffusion barrier layer 108 is formed over the upper surface 109 of the piezoelectric layer 107 using a known method. Without wishing to be bound by theory, the Applicants believe is that under high electrical power operation, and without the second diffusion barrier layer 108, the structural integrity of the BAW resonator 100, and more specifically the interface between the second electrode 110 and the piezoelectric layer 107, may delaminate ('unzip') at the interface of the second electrode 110, and the and the piezoelectric layer 107 (e.g., ASN. Alternatively, and again without wishing to be bound by theory, Applicants hypothesize that with the higher scandium content in the ASN piezoelectric layers of more recent BAW resonators, and the columnar nature of the ASN growth, are can exhibit local inhomogeneities (perhaps along grain boundaries) which permit a low temperature ternary alloy to form and result in the melting, sputtering and migration of material (e.g., Mo) from an electrode into the piezoelectric layer (e.g., ASN).

Applicants have discovered that by providing the second diffusion barrier layer 108 over the upper surface 109 of the piezoelectric layer 107, the incidence of diffusion of material from the second electrode 110 into the piezoelectric layer 107 is significantly curbed. This results in suppression of the noted bulk defects in the resultant piezoelectric layer, and a more uniform piezoelectric layer 107 with fewer incidents of clustering of voids caused by diffusing electrode material (e.g., Mo). Beneficially, by preventing the formation of voids in the piezoelectric layer 107 by the present teachings, the desired crystalline nature of the highly textured piezoelectric layer 107, and the attendant benefits in acoustic and electrical performance of the BAW resonator 100, are realized.

Notably, the addition of any layer to the acoustic stack 102 of the BAW resonator 100 can impact the acoustic properties, and acoustic and electric performance of the BAW resonator. Accordingly, the material selected for the second diffusion barrier layer 108 is selected to have compatible acoustic properties with other layers in the acoustic stack 102 of the BAW resonator so as to avoid as much as possible undesired impact on the function of the acoustic stack 102. As such, providing a suitably benign second diffusion barrier layer 108 includes selection of not only a material having suitable acoustic properties such as acoustic propagation velocity, and acoustic impedance. In accordance with a representative embodiment, the material selected for the second diffusion barrier layer 108 has an acoustic velocity is in the range of approximately from 1.2 mm/s to approximately 6.5 mm/s. In accordance with a representative embodiment, the material selected for the second diffusion barrier layer 108 is in the range of approximately 17 MRayl to approximately 101 MRayl. Notably, however, even in the case where the barrier material(s) selected for the second diffusion barrier layer 108 does not possess optimal acoustic properties, the negative impact to the overall acoustic performance of the stack can be mitigating by using a thin layer of the barrier material. In some representative embodiments, the second diffusion barrier layer 108 has a thickness in the range of approximately 10 Å to approximately 25 Å. Even such a comparatively thin second diffusion barrier layer 108 selected from certain illustrative materials described below, provide acceptable adhesion and diffusion-barrier properties. More generally, so as to not adversely impact the acoustic properties of the acoustic stack 140, the second diffusion barrier layer 108 is generally required to be comparatively thin (y-dimension in the coordinate system of FIG. 1B). Illustratively, in certain representative embodiments, the second diffusion barrier layer 108 has a thickness in the range of approximately 10 Å to approximately 100 Å. In other representative embodiments, the second diffusion barrier layer 108 has a thickness in the range of approximately 10 Å to approximately 500 Å.

In certain embodiments, the second diffusion barrier layer 108 is a single material. In other representative embodiments, the second diffusion barrier layer 108 comprises two materials. In some representative embodiments, the two materials form a single layer comprising a compound of the two materials, and in other representative embodiments, the second diffusion barrier layer 108 comprises a first layer of the first material, and a second layer of the second material.

In accordance with a representative embodiment, the second diffusion barrier layer 108 comprises titanium (Ti). As will be appreciated by one of ordinary skill in the art, elemental titanium provides adequate adhesive properties, and thereby provides good adhesion of the first electrode 104 to the piezoelectric layer 107.

In accordance with another representative embodiment, the second diffusion barrier layer 108 comprises titanium nitride (TiN) or titanium oxide (TiO). In addition to providing good adhesion, and a sufficient acoustic and electrical conductance elastic modulus, these materials are superior diffusion barriers.

In accordance with another representative embodiment, the second diffusion barrier layer 108 comprises a substantially uniform binary layer (i.e., compound) of titanium and tungsten (i.e., TiW). As will be appreciated, in addition to providing good adhesion, and a sufficient acoustic and electrical conductance, titanium and tungsten provide superior diffusion barriers to the acoustic stack 102 of the BAW resonator 100. In accordance with a representative embodiment, the second diffusion barrier layer 108 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 102, with the presence of titanium (Ti) in the tungsten (W) matrix of the alloy providing a good barrier layer as well.

In accordance with another representative embodiment, the second diffusion barrier layer 108 comprises a layer of titanium (Ti) and a layer of platinum (Pt). In some embodiments, the titanium layer is disposed between the piezoelectric layer 107 and the platinum layer; and in other embodiments, the platinum layer is disposed between the piezoelectric layer 107 and the titanium. As noted above, titanium provides beneficial adhesion to aid in preventing delamination as described above, and platinum provides a beneficial diffusion barrier. As will be appreciated, in addition to providing good adhesion, and a sufficient acoustic and electrical conductance, titanium and platinum provide superior diffusion barriers to the acoustic stack 102 of the BAW resonator 100.

As noted above, in certain representative embodiments, the second diffusion barrier layer 108 has a thickness in the range of approximately 10 Å to approximately 100 Å; and in other representative embodiments, the second diffusion barrier layer 108 has a thickness in the range of approximately 10 Å to approximately 500 Å. In representative embodiments including a bi-layer second diffusion barrier layer 108, the Ti layer is disposed by a known method first over the first electrode 104, and the Pt layer is disposed by a known method over the Ti layer, and beneath the piezoelectric layer 107. In accordance with a representative embodiment, the titanium layer has a thickness of approximately 10 Å, and the platinum layer thickness of approximately 500 Å.

In another representative embodiment, the second diffusion barrier layer 108 is platinum (Pt). In addition to providing suitable adhesive and diffusive barrier properties, platinum has been found to 'smooth' the upper surface 109 of the piezoelectric layer 107. To this end, Applicants have discovered that the upper surface 109 of the piezoelectric layer 107, which is illustratively ASN, can be comparatively rough. This surface roughness can impact the integrity of the interface between the piezoelectric layer and the electrode disposed thereover in known BAW resonators. This lack of uniformity can result in localized areas of comparatively high electric field strength, which in turn have a deleterious impact on the electric and acoustic performance of the BAW resonator. However, by the present teachings, in a representative embodiment in which the second diffusion barrier layer 108 comprises platinum, the smoothing aspect of platinum results in a better/more uniform interface and, ultimately, better electric and acoustic performance of the BAW resonator 100 compared to certain known BAW resonators.

In accordance with a representative embodiment, the second diffusion barrier layer 108 is platinum (Pt). As noted above, in addition to providing suitable adhesive and diffusive barrier properties, platinum has been found to 'smooth' the upper surface 109 of the piezoelectric layer 107, which in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interface to a uniform depth roughly twice that of the deposited platinum (Pt). When applied to the chemically similar piezoelectric material, which is also a III-V material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface.

In certain representative embodiments, and as will be readily apparent to one of ordinary skill in the art, an etching step using a known etchant (e.g., HF) is used, for example, to form the cavity, of the BAW resonator 100. Applicants have found that subjecting the diffusion barrier layers (e.g., second diffusion barrier layer 108) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the second diffusion barrier layer 108 over the upper surface 109 of the piezoelectric layer 107, the acoustic coupling coefficient ($kt^2$), and its attendant parameters, resistance at parallel resonance (Rp), and resistance at series resonance (Rs) are at least acceptable to the performance requirements of the BAW resonator 100. Similarly, the overall Q of the device is at least acceptable.

Figure 1C:
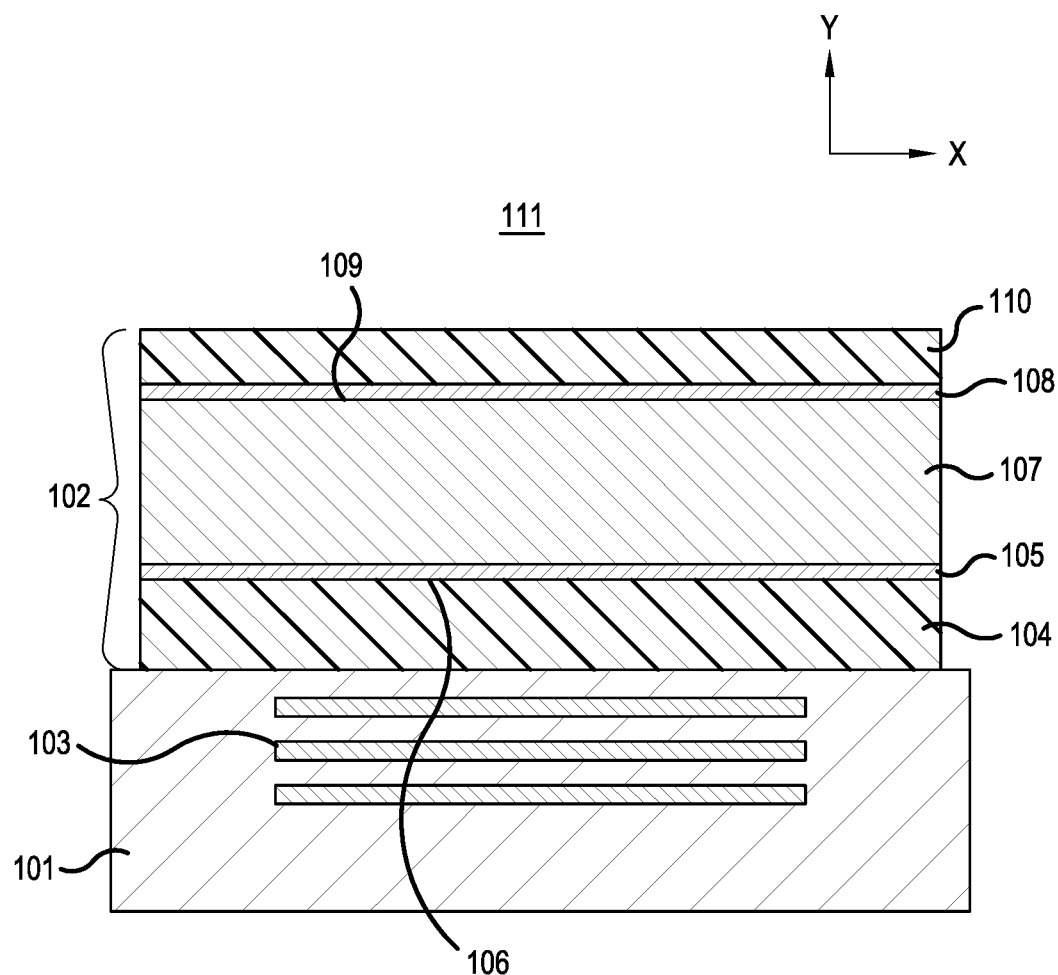
FIG. 1C is a cross-sectional view of a BAW resonator according to a representative embodiment.

FIG. 1C is a cross-sectional view of BAW resonator 111, according to a representative embodiment. The BAW resonator 111 comprises substrate 101, with acoustic stack 102 disposed over a reflective element 103, which, in the present representative embodiment, is a Bragg reflector, which comprises alternating layers of high acoustic impedance material and low acoustic impedance material. As such, the BAW resonator 111 is an SMR.

The acoustic stack 102 comprises: first electrode 104 disposed over the substrate 101; first diffusion barrier layer 105 disposed over an upper surface 106 of the first electrode 104; piezoelectric layer 107 disposed over the first diffusion barrier layer 105; second diffusion barrier layer 108 is disposed over upper surface 109 of the piezoelectric layer 107; and second electrode 110 is disposed over the second diffusion barrier layer 108.

In representative embodiments, the first and second electrodes illustratively comprise molybdenum (Mo), and the substrate 101 comprises silicon (Si). These materials are merely illustrative, and it is emphasized that other materials, such as disclosed in the above-incorporated patents and patent application publications, are contemplated.

The piezoelectric layer 107 comprises a highly-textured, doped piezoelectric material, and may be formed using a known method, such as described in above-incorporated U.S. Pat. Nos. 9,455,681, 9,679,765 and U.S. Patent Publication 20140132117. Piezoelectric layer 107 comprises a thin film piezoelectric comprising $Al_{1-x}Sc_xN$. In some embodiments, piezoelectric layer 107 are formed on a seed layer (not shown) disposed over respective upper surfaces of first and second electrodes 104, 110. The seed layer may comprise Al, for instance, to foster growth of $Al_{1-x}Sc_xN$.

As indicated above, the use of $Al_{1-x}Sc_xN$ in this manner allows BAW resonator 100 to achieve the benefits typically associated with an BAW resonator while avoiding or compensating for the corresponding drawbacks, such as decreased piezoelectric coupling coefficient and Q factor, and increased insertion loss, and an unacceptably thick piezoelectric layer.

Piezoelectric layer 107 is typically formed by a sputtering process using one or more scandium-doped aluminum sputtering targets in an atmosphere comprising at least nitrogen gas, typically in combination with one or more inert gases such as argon. The sputtering targets are typically doped with a percentage of scandium atoms corresponding to a desired composition of piezoelectric layer 107. For instance, in some embodiments, a sputtering target may be doped with approximately 3.0 to 40.0 percent scandium atoms to produce a piezoelectric layer of $Al_{1-x}Sc_xN$ where x is between approximately 0.03 and 0.40. Again, further details of sputtering from a target are found, for example, in U.S. Patent Application Publication No. 20140132117, and U.S. Pat. No. 9,679,765 to Larson III, et al.

When percentages of doping elements in a piezoelectric layer, it is in reference to the total atoms of the piezoelectric layer. Notably, when the percentages of doping elements (e.g., Sc) in a doped AlN layer are discussed herein, it is in reference to the total atoms (not including nitrogen) of the AlN piezoelectric layer. So, for example, and as described for example in U.S. Patent Application Publication No. 20140132117, if the Sc in the piezoelectric layer of a representative embodiment has an atomic percentage of approximately 5.0%, and the Al has an atomic percentage of approximately 95.0%, then the atomic consistency of the piezoelectric layer may then be represented as $Al_{0.95}Sc_{0.05}N$.

Various embodiments include providing a thin film of piezoelectric material (e.g., piezoelectric layer 107), with an enhanced piezoelectric coefficient $d_{33}$ and an enhanced electromechanical coupling coefficient $kt^2$ by incorporating one or more rare earth elements into the crystal lattice of a portion of the piezoelectric layer. By incorporating specific atomic percentages of the multiple rare earth elements, the piezoelectric properties of the piezoelectric material, including piezoelectric coefficient $d_{33}$ and enhanced electromechanical effective coupling coefficient $kt^2$, are improved as compared to the same piezoelectric material that is entirely stoichiometric (undoped).

In accordance with a representative embodiment, the piezoelectric layer 107 comprises AlN material doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material. As such, electric dipoles of the piezoelectric material of piezoelectric layer 107 are altered in such a way that an electrical field produces a comparatively strong mechanical response of the dipoles, resulting in a higher $kt^2$. As noted above, the atomic percentage of scandium in the aluminum nitride layer (i.e., the atomic percent of Sc in Sc—Al inside the Al—Sc—N material) is approximately 3.0% to approximately 40.0%; and in other representative embodiments, the percentage of scandium in an aluminum nitride layer is approximately greater than approximately 5.0% to approximately 40.0%

Alternatively, a number of Al atoms within the AlN crystal lattice may be replaced with other rare earth element(s) at predetermined percentages. The rare earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein. Because the doping elements replace only Al atoms in the AlN crystal, the percentage of nitrogen atoms in the piezoelectric material remains substantially the same regardless of the amount of doping. As such, and as noted above, when percentages of doping elements are discussed herein, it is in reference to the total atoms (not including nitrogen) of the AlN piezoelectric material.

In other representative embodiments, the piezoelectric layer 107 is not doped. Notably, and as described in above-incorporated U.S. Pat. No. 9,917,567, in certain comparatively high-frequency applications, the thickness of the acoustic stack 102, including piezoelectric layer 107, which is undoped in this illustrative example, is comparatively thin. In known BAW resonators a thin acoustic stack results in comparatively high electric fields under high power. Because the acoustic stack of the known BAW resonator is comparative thin, the thermal conductance from the center of the active area to the outer edges thereof is increased. As such, the heat carrying capacity of the known BAW resonator would be reduced creating a situation where the BAW known BAW resonator reaches a comparatively high operating temperature. Under high temperature, the structural integrity of the known BAW resonator, including include the interface between the piezoelectric layer and the top and bottom electrodes, would be further stressed. Ultimately, in known BAW resonators, delamination can occur between piezoelectric layer and the top and bottom electrodes. By contrast, and as described more fully herein, first diffusion barrier layer 105 and second diffusion barrier layer 108, in addition to increasing the interface adhesion/integrity respective first and second electrodes 104, 110, provide a diffusion barrier that also substantially prevents the formation of a lower temperature ternary material) from forming.

As noted above, as power requirements for BAW resonators increase, in certain known BAW resonators, diffusion of electrode material into the piezoelectric layer can create voids in the piezoelectric layer. These voids, which are in bulk defects in the crystalline structure of the piezoelectric layer, can have a deleterious impact on desired characteristics of the piezoelectric material, and on BAW resonators comprising such piezoelectric material. Stated somewhat differently, the piezoelectric layer is highly textured. The highly textured piezoelectric layer beneficially fosters good acoustic properties in the material, which result in good acoustic and electrical performance of the BAW resonator, and electrical devices (e.g., filters) incorporating the BAW resonator. The occurrence of voids resulting from diffusion of material from the electrode(s) (e.g., Mo) disturbs the highly-ordered crystalline structure of the piezoelectric layer. As will be appreciated by one of ordinary skill in the art, these voids (bulk defects) can result in significant variation of the acoustic coupling coefficient ($kt^2$) doped piezoelectric layer, where this variation increases with increasing occurrence of bulk defects. Similarly, other parameters, such as the resistance at parallel resonance ($R_p$) and the overall quality factors of BAW resonators made from such a wafer can vary significantly as well. As can be appreciated, such variability of material and device parameters across a wafer comprising many BAW resonators is unacceptable.

Without wishing to be bound by theory, the Applicants believe is that under high electrical power operation, and without the first diffusion barrier layer 105, the structural integrity of the BAW resonator 100, and more specifically the interface between the first electrode 104, and the piezoelectric layer 107 may delaminate ('unzip') at the interface of the first electrode 104 (e.g., Mo) and the piezoelectric layer 107 (e.g., ASN). Alternatively, and again without wishing to be bound by theory, Applicants hypothesize that with the higher scandium content in the ASN piezoelectric layers of more recent BAW resonators, and the columnar nature of the ASN growth, are local inhomogeneities (perhaps along grain boundaries) which permit a low temperature ternary alloy to form and result in the melting, sputtering and migration of material (e.g., Mo) from an electrode into the piezoelectric layer (e.g., ASN).

Applicants have discovered that by providing the first diffusion barrier layer 105 over the upper surface 106 of the first electrode 104, the incidence of diffusion of material from the first electrode 104 into the piezoelectric layer 107 is significantly curbed. This results in suppression of the noted bulk defects in the resultant piezoelectric layer, and a more uniform piezoelectric layer 107 with fewer incidents of clustering of voids cause by diffusing electrode material (e.g., Mo). Beneficially, by preventing the formation of voids in the piezoelectric layer 107 by the present teachings, the desired crystalline nature of the highly textured piezoelectric layer 107, and the attendant benefits in acoustic and electrical performance of the BAW resonator 100 are realized.

Notably, the addition of any layer to the acoustic stack 102 of the BAW resonator 100 can impact the acoustic properties, and acoustic and electric performance of the BAW resonator. Accordingly, the material selected for the first diffusion barrier layer 105 is selected to have compatible acoustic properties with other layers in the acoustic stack 102 of the BAW resonator so as to avoid as much as possible undesired impact on the function of the acoustic stack 102. As such, providing a suitably benign first diffusion barrier layer 105 includes selection of not only a material having a suitable acoustic properties such as acoustic propagation velocity, and acoustic impedance. In accordance with a representative embodiment, the material selected for the first diffusion barrier layer 105 has an acoustic velocity is in the range of approximately 1.2 mm/s to approximately 6.5 mm/s. In accordance with a representative embodiment, the material selected for the first diffusion barrier layer 105 is in the range of approximately 25 MRayl to approximately 101 MRayl. Notably, however, even in the case where the barrier material(s) selected for the first diffusion barrier layer does not possess optimal acoustic properties, the negative impact to the overall acoustic performance of the stack can be mitigating by using a thin layer of the barrier material. In some representative embodiments, the first diffusion barrier layer 105 has a thickness in the range of approximately 10 Å to approximately 25 Å. Even such a comparatively thin first diffusion barrier layer 105 selected from certain illustrative materials described below, provide acceptable adhesion and diffusion-barrier properties. More generally, so as to not adversely impact the acoustic properties of the acoustic stack 102, the first diffusion barrier layer 105 is generally required to be comparatively thin (y-dimension in the coordinate system of FIG. 1B). Illustratively, in certain representative embodiments, the first diffusion barrier layer 105 has a thickness in the range of approximately 50 Å to approximately 100 Å. In other representative embodiments, the first diffusion barrier layer 105 has a thickness in the range of approximately 50 Å to approximately 500 Å.

In certain embodiments, the first diffusion barrier layer 105 is a single material. In other representative embodiments, the first diffusion barrier layer 105 comprises two materials. In some representative embodiments, the two materials form a single layer comprising a compound of the two materials, and in other representative embodiments, the first diffusion barrier layer comprises a first layer of the first material, and a second layer of the second material.

In accordance with a representative embodiment, the first diffusion barrier layer 105 comprises titanium (Ti). As will be appreciated by one of ordinary skill in the art, elemental titanium provides adequate adhesive properties, and thereby provides good adhesion of the first electrode 104 to the piezoelectric layer 107.

In accordance with another representative embodiment, the first diffusion barrier layer 105 comprises titanium nitride (TiN) or titanium oxide (TiO). In addition to providing good adhesion, and a sufficient elastic modulus, these materials are superior diffusion barrier.

In accordance with another representative embodiment, the first diffusion barrier layer 105 comprises a substantially uniform binary layer (i.e., compound) of titanium and tungsten (i.e., TiW). As will be appreciated, in addition to providing good adhesion, and a sufficient acoustic and electrical conductance, titanium and tungsten provide superior diffusion barriers to the acoustic stack 102 of the BAW resonator 100. In accordance with a representative embodiment, the first diffusion barrier layer 105 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 102, with the presence of titanium (Ti) in the tungsten (W) matrix of the alloy providing a good barrier layer as well.

In accordance with another representative embodiment, the first diffusion barrier layer 105 comprises a layer of titanium (Ti) and a layer of platinum (Pt). In some embodiments, the titanium layer is disposed between the piezoelectric layer 107 and the platinum layer; and in other embodiments, the platinum layer is disposed between the piezoelectric layer 107 and the titanium. As noted above, titanium provides beneficial adhesion to aid in preventing delamination as described above, and platinum provides a beneficial diffusion barrier. As such, in addition to providing good adhesion, and a sufficient acoustic and electrical conductance, titanium and platinum provide superior diffusion barriers.

As noted above, in certain representative embodiments, the first diffusion barrier layer 105 has a thickness in the range of approximately 10 Å to approximately 100 Å; and in other representative embodiments, the first diffusion barrier layer 105 has a thickness in the range of approximately 10 Å to approximately 500 Å. In representative embodiments including a bi-layer first diffusion barrier layer 105, the Ti layer is disposed by a known method first over the first electrode 104, and the Pt layer is disposed by a known method over the Ti layer, and beneath the piezoelectric layer 107. In accordance with a representative embodiment, the titanium layer has a thickness of approximately 10 Å, and the platinum layer thickness of approximately 500 Å.

In another representative embodiment, the first diffusion barrier layer 105 is platinum (Pt). In addition to providing suitable adhesive and diffusive barrier properties, and as will be explained more fully below with the description of a second diffusion barrier layer 108, platinum has been found to 'smooth' the surface of the piezoelectric layer 107, which in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interfaces to a uniform depth roughly twice that of the deposited platinum (Pt). When applied to the chemically similar piezoelectric material, which is also a III-V material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface.

In certain representative embodiments, and as will be readily apparent to one of ordinary skill in the art, an etching step using a known etchant (e.g., HF) is used, for example, to form the cavity, of the BAW resonator 100. Applicants have found that subjecting the diffusion barrier layers (e.g., second diffusion barrier layer 108) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the first diffusion barrier layer 105 over the upper surface 106 of the piezoelectric layer 107, the acoustic coupling coefficient ($kt^2$), and its attendant parameters, resistance at parallel resonance (Rp), and resistance at series resonance (Rs) are at least acceptable to the performance requirements of the BAW resonator 100. Similarly, the overall Q of the device is at least acceptable.

As depicted in FIG. 1C, the second diffusion barrier layer 108 is formed over the upper surface 109 of the piezoelectric layer 107 using a known method. Without wishing to be bound by theory, the Applicants believe is that under high electrical power operation, and without the second diffusion barrier layer 108, the structural integrity of the BAW resonator 100, and more specifically the interface between the second electrode 110 and the piezoelectric layer 107, may delaminate ('unzip') at the interface of the second electrode 110, and the and the piezoelectric layer 107 (e.g., ASN). Alternatively, and again without wishing to be bound by theory, Applicants hypothesize that with the higher scandium content in the ASN piezoelectric layers of more recent BAW resonators, and the columnar nature of the ASN growth, are local inhomogeneities (perhaps along grain boundaries) which permit a low temperature ternary alloy to form and result in the melting, sputtering and migration of material (e.g., Mo) from an electrode into the piezoelectric layer (e.g., ASN).

Applicants have discovered that by providing the second diffusion barrier layer 108 over the upper surface 109 of the piezoelectric layer 107, the incidence of diffusion of material from the first electrode 104 into the piezoelectric layer 107 is significantly curbed. This results in suppression of the noted bulk defects in the resultant piezoelectric layer, and a more uniform piezoelectric layer 107 with fewer incidents of clustering of voids cause by diffusing electrode material (e.g., Mo). Beneficially, by preventing the formation of voids in the piezoelectric layer 107 by the present teachings, the desired crystalline nature of the highly textured piezoelectric layer 107, and the attendant benefits in acoustic and electrical performance of the BAW resonator 100, are realized.

Notably, the addition of any layer to the acoustic stack 102 of the BAW resonator 100 can impact the acoustic properties, and acoustic and electric performance of the BAW resonator. Accordingly, the material selected for the second diffusion barrier layer 108 is selected to have compatible acoustic properties with other layers in the acoustic stack 102 of the BAW resonator so as to avoid as much as possible undesired impact on the function of the acoustic stack 102. As such, providing a suitably benign second diffusion barrier layer 108 includes selection of not only a material having suitable acoustic properties such as acoustic propagation velocity, and acoustic impedance. In accordance with a representative embodiment, the material selected for the second diffusion barrier layer 108 has an acoustic velocity is in the range of approximately 1.2 mm/s to approximately 6.5 mm/s. In accordance with a representative embodiment, the material selected for the second diffusion barrier layer 108 is in the range of approximately 17 MRayl to approximately 101 MRayl. Notably, however, even in the case where the barrier material(s) selected for the second diffusion barrier layer 108 does not possess optimal acoustic properties, the negative impact to the overall acoustic performance of the stack can be mitigating by using a thin layer of the barrier material. In some representative embodiments, the second diffusion barrier layer 108 has a thickness in the range of approximately 10 Å to approximately 25 Å. Even such a comparatively thin second diffusion barrier layer 108 selected from certain illustrative materials described below, provide acceptable adhesion and diffusion-barrier properties. More generally, so as to not adversely impact the acoustic properties of the acoustic stack 140, the second diffusion barrier layer 108 is generally required to be comparatively thin (y-dimension in the coordinate system of FIG. 1C). Illustratively, in certain representative embodiments, the second diffusion barrier layer 108 has a thickness in the range of approximately 10 Å to approximately 100 Å. In other representative embodiments, the second diffusion barrier layer 108 has a thickness in the range of approximately 10 Å to approximately 500 Å.

In certain embodiments, the second diffusion barrier layer 108 is a single material. In other representative embodiments, the second diffusion barrier layer 108 comprises two materials. In some representative embodiments, the two materials form a single layer comprising a compound of the two materials, and in other representative embodiments, the first diffusion barrier layer comprises a first layer of the first material, and a second layer of the second material.

In accordance with a representative embodiment, the second diffusion barrier layer 108 comprises titanium (Ti). As will be appreciated by one of ordinary skill in the art, elemental titanium provides adequate adhesive properties, and thereby provides good adhesion of the first electrode 104 to the piezoelectric layer 107.

In accordance with another representative embodiment, the second diffusion barrier layer 108 comprises titanium nitride (TiN) or titanium oxide (TiO). In addition to providing good adhesion, and a sufficient elastic modulus, and a sufficient acoustic and electrical conductance, these materials are superior diffusion barrier.

In accordance with another representative embodiment, the second diffusion barrier layer 108 comprises a substantially uniform binary (i.e., compound) layer of titanium and tungsten (i.e., TiW). As will be appreciated, in addition to providing good adhesion, and a sufficient acoustic and electrical conductance, titanium and tungsten provide superior diffusion barriers to the acoustic stack 102 of the BAW resonator 100. In accordance with a representative embodiment, the second diffusion barrier layer 108 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 102, with the presence of titanium (Ti) in the tungsten (W) matrix of the alloy providing a good barrier layer as well.

In accordance with another representative embodiment, the second diffusion barrier layer 108 comprises a layer of titanium (Ti) and a layer of platinum (Pt). In some embodiments, the titanium layer is disposed between the piezoelectric layer 107 and the platinum layer; and in other embodiments, the platinum layer is disposed between the piezoelectric layer 107 and the titanium. As noted above, titanium provides beneficial adhesion to aid in preventing delamination as described above, and platinum provides a beneficial diffusion barrier. As will be appreciated, in addition to providing good adhesion, and a sufficient acoustic and electrical conductance, titanium and platinum provide superior diffusion barriers to the acoustic stack 102 of the BAW resonator 100.

As noted above, in certain representative embodiments, the second diffusion barrier layer 108 has a thickness in the range of approximately 10 Å to approximately 100 Å; and in other representative embodiments, the second diffusion barrier layer 108 has a thickness in the range of approximately 10 Å to approximately 500 Å. In representative embodiments including a bi-layer second diffusion barrier layer 108, the Ti layer is disposed by a known method first over the first electrode 104, and the Pt layer is disposed by a known method over the Ti layer, and beneath the piezoelectric layer 107. In accordance with a representative embodiment, the titanium layer has a thickness of approximately 10 Å, and the platinum layer thickness of approximately 500 Å.

In another representative embodiment, the second diffusion barrier layer 108 is platinum (Pt). As noted above, in addition to providing suitable adhesive and diffusive barrier properties, platinum has been found to 'smooth' the surface of the piezoelectric layer 107, which in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interface to a uniform depth roughly twice that of the deposited platinum (Pt). When applied to the chemically similar piezoelectric material, which is also a III-V material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface.

In addition to providing suitable adhesive and diffusive barrier properties, platinum has been found to 'smooth' the upper surface 109 of the piezoelectric layer 107. To this end, Applicants have discovered that the upper surface 109 of the piezoelectric layer 107, which is illustratively ASN, can be comparatively rough. This surface roughness can impact the integrity of the interface between the piezoelectric layer and the electrode disposed thereover in known BAW resonators. This lack of uniformity can result in localized areas of comparatively high electric field strength, which in turn have a deleterious impact on the electric and acoustic performance of the BAW resonator. However, by the present teachings, in a representative embodiment in which the second diffusion barrier layer 108 comprises platinum, the smoothing aspect of platinum results in a better/more uniform interface and, ultimately, better electric and acoustic performance of the BAW resonator 111 compared to certain known BAW resonators.

In certain representative embodiments, and as will be readily apparent to one of ordinary skill in the art, an etching step using a known etchant (e.g., HF) is used, for example, to form the cavity, of the BAW resonator 111. Applicants have found that subjecting the diffusion barrier layers (e.g., second diffusion barrier layer 108) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the second diffusion barrier layer 108 over the upper surface 109 of the piezoelectric layer 107, the acoustic coupling coefficient ($kt^2$), and its attendant parameters, resistance at parallel resonance (Rp), and resistance at series resonance (Rs) are at least acceptable to the performance requirements of the BAW resonator 100. Similarly, the overall Q of the device is at least acceptable.

Figure 2A:
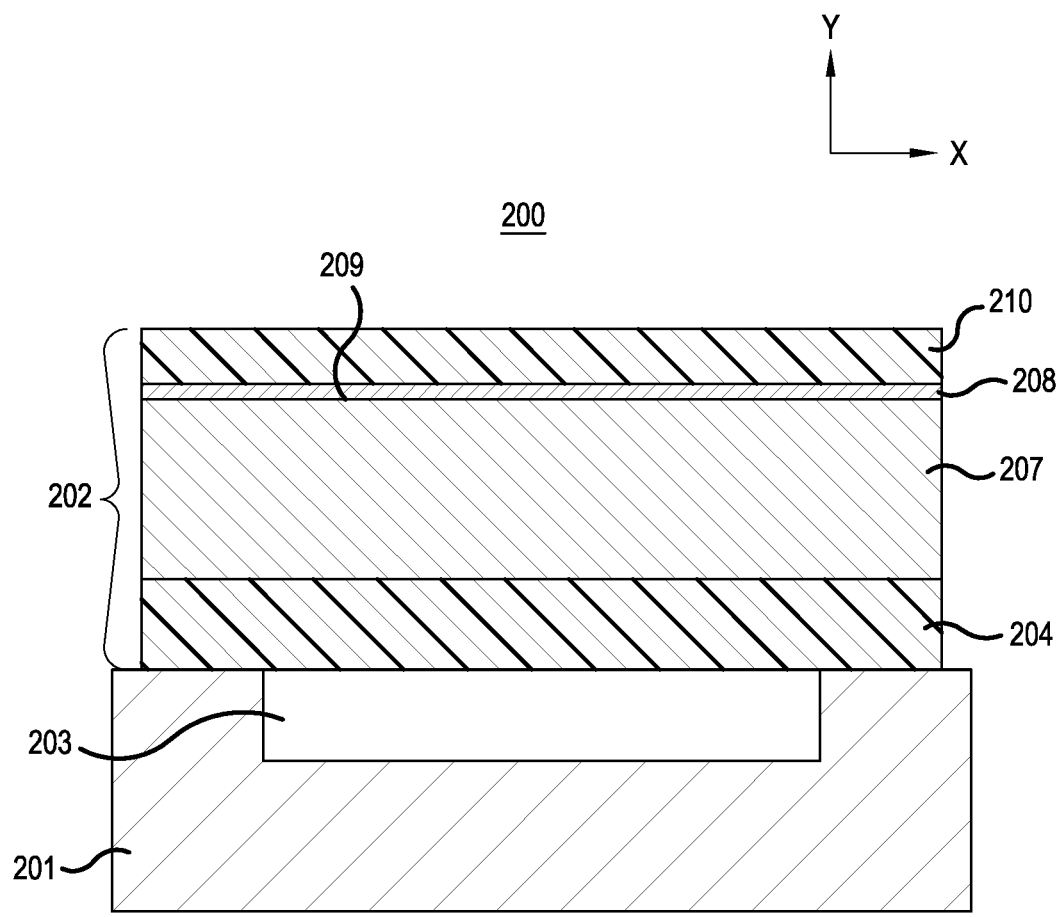
FIG. 2A is a cross-sectional view of a BAW resonator according to a representative embodiment.

FIG. 2A is a cross-sectional view of BAW resonator 200, according to a representative embodiment. Many aspects and details of the BAW resonator 200 are common to BAW resonator 100 described above. Common aspects and details may not be repeated.

The BAW resonator 200 comprises a substrate 201, with an acoustic stack 202 disposed over a reflective element 203, which, in the present representative embodiment, is a cavity provided in the substrate 201. The acoustic stack comprises a first electrode 204 disposed over the substrate 201, a piezoelectric layer 207 disposed over the first electrode 204, and a diffusion barrier layer 208 disposed over an upper surface 209 of the piezoelectric layer 207. A second electrode 210 is disposed over the diffusion barrier layer 208.

As noted above, because the reflective element 203 is a cavity or void beneath the first electrode 204, the BAW resonator 200 is often referred to as an FBAR.

In representative embodiments, the first and second electrodes illustratively comprise molybdenum (Mo), and the substrate 201 comprises silicon (Si). These materials are merely illustrative, and it is emphasized that other materials, such as disclosed in the above-incorporated patents and patent application publications, are contemplated.

The piezoelectric layer 207 comprises a highly-textured, doped piezoelectric material, and may be formed using a known method, such as described in above-incorporated U.S. Pat. Nos. 9,455,681, 9,679,765 and U.S. Patent Publication 20140132117. Piezoelectric layer 207 comprises a thin film piezoelectric comprising $Al_{1-x}Sc_xN$. In some embodiments, piezoelectric layer 207 are formed on a seed layer (not shown) disposed over respective upper surfaces of first and second electrodes 204, 210. The seed layer may comprise Al, for instance, to foster growth of $Al_{1-x}Sc_xN$.

As indicated above, the use of $Al_{1-x}Sc_xN$ in this manner allows BAW resonator 200 to achieve the benefits typically associated with an BAW resonator while avoiding or compensating for the corresponding drawbacks, such as decreased piezoelectric coupling coefficient and Q factor, and increased insertion loss, and an unacceptably thick piezoelectric layer.

Piezoelectric layer 207 is typically formed by a sputtering process using one or more scandium-doped aluminum sputtering targets in an atmosphere comprising at least nitrogen gas, typically in combination with one or more inert gases such as argon. The sputtering targets are typically doped with a percentage of scandium atoms corresponding to a desired composition of piezoelectric layer 207. For instance, in some embodiments, a sputtering target may be doped with approximately 3.0 to 40.0 percent scandium atoms to produce a piezoelectric layer of $Al_{1-x}Sc_xN$ where x is between approximately 0.03 and 0.40. Again, further details of sputtering from a target are found, for example, in U.S. Patent Application Publication No. 20140132117, and U.S. Pat. No. 9,679,765 to Larson III, et al.

When percentages of doping elements in a piezoelectric layer, it is in reference to the total atoms of the piezoelectric layer. Notably, when the percentages of doping elements (e.g., Sc) in a doped AlN layer are discussed herein, it is in reference to the total atoms (not including nitrogen) of the AlN piezoelectric layer. So, for example, and as described for example in U.S. Patent Application Publication No. 20140132117, if the Sc in the piezoelectric layer of a representative embodiment has an atomic percentage of approximately 5.0%, and the Al has an atomic percentage of approximately 95.0%, then the atomic consistency of the piezoelectric layer may then be represented as $Al_{0.95} Sc_{0.05}$ N.

Various embodiments relate to providing a thin film of piezoelectric material (e.g., piezoelectric layer 207), with an enhanced piezoelectric coefficient $d_{33}$ and an enhanced electromechanical coupling coefficient $kt^2$ by incorporating one or more rare earth elements into the crystal lattice of a portion of the piezoelectric layer. By incorporating specific atomic percentages of the multiple rare earth elements, the piezoelectric properties of the piezoelectric material, including piezoelectric coefficient $d_{33}$ and enhanced electromechanical effective coupling coefficient $kt^2$, are improved as compared to the same piezoelectric material that is entirely stoichiometric (undoped).

In accordance with a representative embodiment, the piezoelectric layer 207 comprises AlN material doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material. As such, electric dipoles of the piezoelectric material of piezoelectric layer 207 are altered in such a way that an electrical field produces a comparatively strong mechanical response of the dipoles, resulting in a higher $kt^2$. As noted above, the atomic percentage of scandium in the aluminum nitride layer (i.e., the atomic percent of Sc in Sc—Al inside the Al—Sc—N material) is approximately 3.0% to approximately 40.0%; and in other representative embodiments, the percentage of scandium in an aluminum nitride layer is approximately greater than approximately 5.0% to approximately 40.0%

Alternatively, a number of Al atoms within the AlN crystal lattice may be replaced with other rare earth element(s) at predetermined percentages. The rare earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein. Because the doping elements replace only Al atoms in the AlN crystal, the percentage of nitrogen atoms in the piezoelectric material remains substantially the same regardless of the amount of doping. As such, and as noted above, when percentages of doping elements are discussed herein, it is in reference to the total atoms (not including nitrogen) of the AlN piezoelectric material.

In other representative embodiments, the piezoelectric layer 207 is not doped. Notably, and as described in above-incorporated U.S. Pat. No. 9,917,567, in certain comparatively high-frequency applications, the thickness of the acoustic stack 202, including piezoelectric layer 207, which is undoped in this illustrative example, is comparatively thin. In known BAW resonators a thin acoustic stack results in comparatively high electric fields under high power. Because the acoustic stack of the known BAW resonator is comparative thin, the thermal conductance from the center of the active area to the outer edges thereof is increased. As such, the heat carrying capacity of the known BAW resonator would be reduced creating a situation where the BAW known BAW resonator reaches a comparatively high operating temperature. Under high temperature, the structural integrity of the known BAW resonator, including include the interface between the piezoelectric layer and the top and bottom electrodes, would be further stressed. Ultimately, in known BAW resonators, delamination can occur between piezoelectric layer and the top and bottom electrodes. By contrast, and as described more fully herein, the diffusion barrier layer 208, in addition to increasing the interface adhesion/integrity respective first and second electrodes 204, 210, beneficially provides an excellent diffusion barrier as described herein.

As depicted in FIG. 2A, the diffusion barrier layer 208 is formed over the upper surface 209 of the piezoelectric layer 207 using a known method. Without wishing to be bound by theory, the Applicants believe is that under high electrical power operation, and without the diffusion barrier layer 208, the structural integrity of the BAW resonator 200, and more specifically the interface between the second electrode 210 and the piezoelectric layer 207, may delaminate ('unzip') at the interface of the second electrode 210, and the and the piezoelectric layer 107 (e.g., ASN). Alternatively, and again without wishing to be bound by theory, Applicants hypothesize that with the higher scandium content in the ASN piezoelectric layers of more recent BAW resonators, and the columnar nature of the ASN growth, are local inhomogeneities (perhaps along grain boundaries), which permit a low temperature ternary alloy to form and result in the melting, sputtering and migration of material (e.g., Mo) from an electrode into the piezoelectric layer (e.g., ASN).

Applicants have discovered that by providing the diffusion barrier layer 208 over the upper surface 209 of the piezoelectric layer 207, the incidence of diffusion of material from the first electrode 204 into the piezoelectric layer 207 is significantly curbed. This results in suppression of the noted bulk defects in the resultant piezoelectric layer, and a more uniform piezoelectric layer 207 with fewer incidents of clustering of voids cause by diffusing electrode material (e.g., Mo). Beneficially, by preventing the formation of voids in the piezoelectric layer 207 by the present teachings, the desired crystalline nature of the highly textured piezoelectric layer 207, and the attendant benefits in acoustic and electrical performance of the BAW resonator 200, are realized.

Notably, the addition of any layer to the acoustic stack 202 of the BAW resonator 200 can impact the acoustic properties, and acoustic and electric performance of the BAW resonator. Accordingly, the material selected for the diffusion barrier layer 208 is selected to have compatible acoustic properties with other layers in the acoustic stack 202 of the BAW resonator so as to avoid as much as possible undesired impact on the function of the acoustic stack 202. As such, providing a suitably benign diffusion barrier layer 208 includes selection of not only a material having a suitable acoustic properties such as acoustic propagation velocity, and acoustic impedance. In accordance with a representative embodiment, the material selected for the diffusion barrier layer 208 has an acoustic velocity is in the range of approximately 1.2 mm/s to approximately 6.5 mm/s. In accordance with a representative embodiment, the material selected for the diffusion barrier layer 208 is in the range of approximately 17 MRayl to approximately 101 MRayl. Notably, however, even in the case where the barrier material(s) selected for the diffusion barrier layer 208 does not possess optimal acoustic properties, the negative impact to the overall acoustic performance of the stack can be mitigating by using a thin layer of the barrier material. In some representative embodiments, the diffusion barrier layer 208 has a thickness in the range of approximately 10 Å to approximately 25 Å. Even such a comparatively thin diffusion barrier layer 208 selected from certain illustrative materials described below, provide acceptable adhesion and diffusion-barrier properties. More generally, so as to not adversely impact the acoustic properties of the acoustic stack 202, the diffusion barrier layer 208 is generally required to be comparatively thin (y-dimension in the coordinate system of FIG. 1B). Illustratively, in certain representative embodiments, the diffusion barrier layer 208 has a thickness in the range of approximately 10 Å to approximately 100 Å. In other representative embodiments, the diffusion barrier layer 208 has a thickness in the range of approximately 10 Å to approximately 500 Å.

In certain embodiments, the diffusion barrier layer 208 is a single material. In other representative embodiments, the diffusion barrier layer 208 comprises two materials. In some representative embodiments, the two materials form a single layer comprising a compound of the two materials, and in other representative embodiments, the first diffusion barrier layer comprises a first layer of the first material, and a second layer of the second material.

In accordance with a representative embodiment, the diffusion barrier layer 208 comprises titanium (Ti). As will be appreciated by one of ordinary skill in the art, elemental titanium provides adequate adhesive properties, and thereby provides good adhesion of the first electrode 204 to the piezoelectric layer 207.

In accordance with another representative embodiment, the diffusion barrier layer 208 comprises titanium nitride (TiN) or titanium oxide (TiO). In addition to providing good adhesion, and a sufficient acoustic and electrical conductance, these materials are superior diffusion barrier.

In accordance with another representative embodiment, the diffusion barrier layer 208 comprises a substantially uniform binary layer (i.e., compound) of titanium and tungsten (i.e., TiW). As will be appreciated, in addition to providing good adhesion, and a sufficient acoustic and electrical conductance, titanium and tungsten provide superior diffusion barriers to the acoustic stack 202 of the BAW resonator 200. In accordance with a representative embodiment, the diffusion barrier layer 208 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 202, with the presence of titanium (Ti) in the tungsten (W) matrix of the alloy providing a good barrier layer as well.

In accordance with another representative embodiment, the diffusion barrier layer 208 comprises a layer of titanium (Ti) and a layer of platinum (Pt). In some embodiments, the titanium layer is disposed between the piezoelectric layer 207 and the platinum layer; and in other embodiments, the platinum layer is disposed between the piezoelectric layer 207 and the titanium. As noted above, titanium provides beneficial adhesion to aid in preventing delamination as described above, and platinum provides a beneficial diffusion barrier. As will be appreciated, in addition to providing good adhesion, and a sufficient acoustic and electrical conductance, titanium and platinum provide superior diffusion barriers to the acoustic stack 202 of the BAW resonator 200.

As noted above, in certain representative embodiments, the diffusion barrier layer 208 has a thickness in the range of approximately 10 Å to approximately 100 Å; and in other representative embodiments, the diffusion barrier layer 208 has a thickness in the range of approximately 10 Å to approximately 500 Å. In representative embodiments including a bi-layer second diffusion barrier layer 108, the Ti layer is disposed by a known method first over the first electrode 204, and the Pt layer is disposed by a known method over the Ti layer, and beneath the piezoelectric layer 207. In accordance with a representative embodiment, the titanium layer has a thickness of approximately 10 Å, and the platinum layer thickness of approximately 500 Å. In accordance with a representative embodiment, the second diffusion barrier layer 108 is platinum (Pt). As noted above, in addition to providing suitable adhesive and diffusive barrier properties, platinum has been found to 'smooth' the surface of the piezoelectric layer 107, which in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interface to a uniform depth roughly twice that of the deposited platinum (Pt). When applied to the chemically similar piezoelectric material, which is also a III-V material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface.

In certain representative embodiments, and as will be readily apparent to one of ordinary skill in the art, an etching step using a known etchant (e.g., HF) is used, for example, to form the cavity, of the BAW resonator 200. Applicants have found that subjecting the diffusion barrier layers (e.g., diffusion barrier layer 208) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the diffusion barrier layer 208 over the upper surface 209 of the piezoelectric layer 207, the acoustic coupling coefficient ($kt^2$), and its attendant parameters, resistance at parallel resonance (Rp), and resistance at series resonance (Rs) are at least acceptable to the performance requirements of the BAW resonator 200. Similarly, the overall Q of the device is at least acceptable.

Figure 2B:
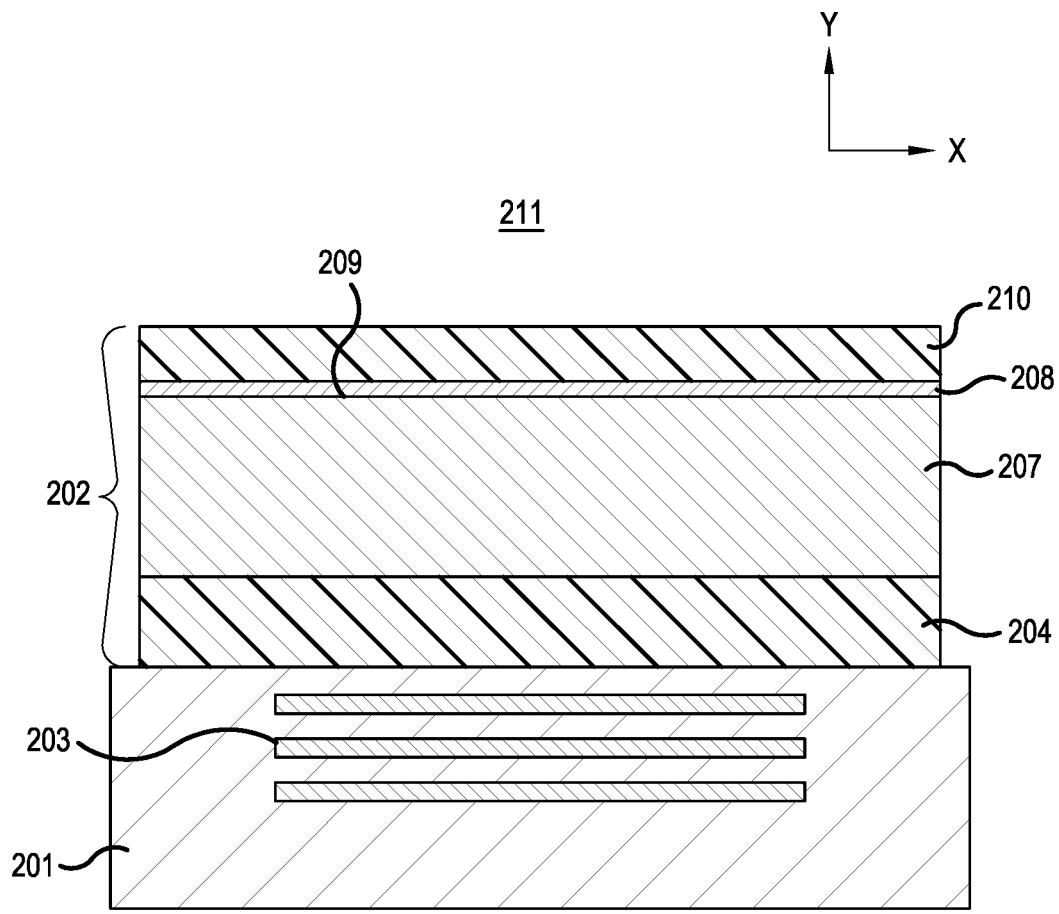
FIG. 2B is a cross-sectional view of a BAW resonator according to a representative embodiment.

FIG. 2B is a cross-sectional view of BAW resonator 211, according to a representative embodiment. The BAW resonator 211 comprises substrate 201; with acoustic stack 202 disposed over a reflective element 203, which, in the present representative embodiment, is a Bragg reflector, which comprises alternating layers of high acoustic impedance material and low acoustic impedance material. As such, the BAW resonator 211 is an SMR. Many aspects and details of the BAW resonator 211 are common to BAW resonator 200 described above. Common aspects and details may not be repeated.

In representative embodiments, the first and second electrodes illustratively comprise molybdenum (Mo), and the substrate 201 comprises silicon (Si). These materials are merely illustrative, and it is emphasized that other materials, such as disclosed in the above-incorporated patents and patent application publications, are contemplated.

The piezoelectric layer 207 comprises a highly-textured, doped piezoelectric material, and may be formed using a known method, such as described in above-incorporated U.S. Pat. No. 9,455,681, and U.S. Patent Publications 20140132117 and 20150311046. Various embodiments relate to providing a thin film of piezoelectric material (e.g., piezoelectric layer 207), with an enhanced piezoelectric coefficient $d_{33}$ and an enhanced electromechanical coupling coefficient $kt^2$ by incorporating one or more rare earth elements into the crystal lattice of a portion of the piezoelectric layer. By incorporating specific atomic percentages of the multiple rare earth elements, the piezoelectric properties of the piezoelectric material, including piezoelectric coefficient $d_{33}$ and enhanced electromechanical effective coupling coefficient $kt^2$, are improved as compared to the same piezoelectric material that is entirely stoichiometric (undoped).

In accordance with a representative embodiment, the piezoelectric layer 207 comprises AlN material doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material. As such, electric dipoles of the piezoelectric material of piezoelectric layer 207 are altered in such way that electrical field produces a comparatively strong mechanical response of the dipoles, resulting in a higher $kt^2$. As noted above, in certain embodiments, the atomic percentage of scandium in the aluminum nitride layer (i.e., the atomic percent of Sc in Sc—Al inside the Al—Sc—N material) is greater than approximately 9.0% to approximately 44.0%; and in other representative embodiments, the atomic percentage of scandium in the aluminum nitride layer (i.e., the atomic percent of Sc in Sc—Al inside the Al—Sc—N material) is greater than approximately 5.0% to approximately 44.0%.

In other representative embodiments, the piezoelectric layer 207 is not doped. Notably, and as described in above-incorporated U.S. Pat. No. 9,917,567, in certain comparatively high-frequency applications, the thickness of the acoustic stack 202, including piezoelectric layer 207, which is undoped in this illustrative example, is comparatively thin. In known BAW resonators a thin acoustic stack results in comparatively high electric fields under high power. Because the acoustic stack of the known BAW resonator is comparative thin, the thermal conductance from the center of the active area to the outer edges thereof is increased. As such, the heat carrying capacity of the known BAW resonator would be reduced creating a situation where the BAW known BAW resonator reaches a comparatively high operating temperature. Under high temperature, the structural integrity of the known BAW resonator, including include the interface between the piezoelectric layer and the top and bottom electrodes, would be further stressed. Ultimately, in known BAW resonators, delamination can occur between piezoelectric layer and the top and bottom electrodes. By contrast, and as described more fully herein, the diffusion barrier layer 208, in addition to increasing the interface adhesion/integrity respective first and second electrodes 204, 210, beneficially provides an excellent diffusion barrier as described herein. As can be appreciated from a review of FIG. 2A, BAW resonator 200 includes only the diffusion barrier layer 208 disposed over the upper surface 209 of the piezoelectric layer 207.

The diffusion barrier layer 208 is formed over the upper surface 209 of the piezoelectric layer 207 using a known method. Without wishing to be bound by theory, the Applicants believe is that under high electrical power operation, and without the diffusion barrier layer 208, structural integrity of the BAW resonator 200, and more specifically the interface between the second electrode 210 and the piezoelectric layer 207, may delaminate ('unzip') at the interface of the second electrode 210, and the and the piezoelectric layer 107 (e.g., ASN). Alternatively, and again without wishing to be bound by theory, Applicants hypothesize that with the higher scandium content in the ASN piezoelectric layers of more recent BAW resonators, and the columnar nature of the ASN growth, are local inhomogeneities (perhaps along grain boundaries) which permit a low temperature ternary alloy to form and result in the melting, sputtering and migration of material (e.g., Mo) from an electrode into the piezoelectric layer (e.g., ASN).

Applicants have discovered that by providing the diffusion barrier layer 208 over the upper surface 209 of the piezoelectric layer 207, the incidence of diffusion of material from the first electrode 204 into the piezoelectric layer 207 is significantly curbed. This results in suppression of the noted bulk defects in the resultant piezoelectric layer, and a more uniform piezoelectric layer 207 with fewer incidents of clustering of voids cause by diffusing electrode material (e.g., Mo). Beneficially, by preventing the formation of voids in the piezoelectric layer 207 by the present teachings, the desired crystalline nature of the highly textured piezoelectric layer 207, and the attendant benefits in acoustic and electrical performance of the BAW resonator 211, are realized.

Notably, the addition of any layer to the acoustic stack 202 of the BAW resonator 200 can impact the acoustic properties, and acoustic and electric performance of the BAW resonator. Accordingly, the material selected for the diffusion barrier layer 208 is selected to have compatible acoustic properties with other layers in the acoustic stack 202 of the BAW resonator so as to avoid as much as possible undesired impact on the function of the acoustic stack 202. As such, providing a suitably benign diffusion barrier layer 208 includes selection of not only a material having a suitable acoustic properties such as acoustic propagation velocity, and acoustic impedance. In accordance with a representative embodiment, the material selected for the diffusion barrier layer 208 has an acoustic velocity is in the range of approximately 1.2 mm/s to approximately. In accordance with a representative embodiment, the material selected for the diffusion barrier layer 208 is in the range of approximately 25 MRayl to approximately 101 MRayl. Notably, however, even in the case where the barrier material(s) selected for the diffusion barrier layer 208 does not possess optimal acoustic properties, the negative impact to the overall acoustic performance of the stack can be mitigating by using a thin layer of the barrier material. In some representative embodiments, the diffusion barrier layer 208 has a thickness in the range of approximately 10 Å to approximately 25 Å. Even such a comparatively thin diffusion barrier layer 208 selected from certain illustrative materials described below, provide acceptable adhesion and diffusion-barrier properties. More generally, so as to not adversely impact the acoustic properties of the acoustic stack 202, the diffusion barrier layer 208 is generally required to be comparatively thin (y-dimension in the coordinate system of FIG. 1B). Illustratively, in certain representative embodiments, the diffusion barrier layer 208 has a thickness in the range of approximately 50 Å to approximately 100 Å. In other representative embodiments, the diffusion barrier layer 208 has a thickness in the range of approximately 50 Å to approximately 500 Å.

In certain embodiments, the diffusion barrier layer 208 is a single material. In other representative embodiments, the diffusion barrier layer 208 comprises two materials. In some representative embodiments, the two materials form a single layer comprising a compound of the two materials, and in other representative embodiments, the first diffusion barrier layer comprises a first layer of the first material, and a second layer of the second material.

In accordance with a representative embodiment, the diffusion barrier layer 208 comprises titanium (Ti). As will be appreciated by one of ordinary skill in the art, elemental titanium provides adequate adhesive properties, and thereby provides good adhesion of the first electrode 204 to the piezoelectric layer 207.

In accordance with another representative embodiment, the diffusion barrier layer 208 comprises titanium nitride (TiN) or titanium oxide (TiO). In addition to providing good adhesion, and a sufficient acoustic and electrical conductance, these materials are superior diffusion barrier.

In accordance with another representative embodiment, the diffusion barrier layer 208 comprises a substantially uniform binary layer (i.e., compound) of titanium and tungsten (i.e., TiW). As will be appreciated, in addition to providing good adhesion, and a sufficient acoustic and electrical conductance, titanium and tungsten provide superior diffusion barriers to the acoustic stack 202 of the BAW resonator 200. In accordance with a representative embodiment, the diffusion barrier layer 208 is a substantially uniform binary layer of TiW is illustratively co-sputtered from a powder target comprising both titanium and tungsten in the proper composition to obtain to result in a final composition that is illustrative approximately 10% (by weight) titanium, and approximately 90% (by weight) tungsten. More generally, a substantially uniform binary metal with approximately 5% to approximately 15% Ti and approximately 95% to approximately 85% W (where the percentages are by weight). Notably, a useful mixture is approximately 10% Ti and approximately 90% W for semiconductor barriers; in this case having a smaller percentage of Ti is good for adhesion and a larger percentage of W improves the overall acoustic performance of the Ti—W alloy in the acoustic stack 202, with the presence of titanium (Ti) in the tungsten (W) matrix of the alloy providing a good barrier layer as well.

In accordance with another representative embodiment, the diffusion barrier layer 208 comprises a layer of titanium (Ti) and a layer of platinum (Pt). In some embodiments, the titanium layer is disposed between the piezoelectric layer 207 and the platinum layer; and in other embodiments, the platinum layer is disposed between the piezoelectric layer 207 and the titanium. As noted above, titanium provides beneficial adhesion to aid in preventing delamination as described above, and platinum provides a beneficial diffusion barrier. As will be appreciated, in addition to providing good adhesion, and a sufficient acoustic and electrical conductance, titanium and platinum provide superior diffusion barriers to the acoustic stack 202 of the BAW resonator 200.

As noted above, in certain representative embodiments, the diffusion barrier layer 208 has a thickness in the range of approximately 10 Å to approximately 100 Å; and in other representative embodiments, the diffusion barrier layer 208 has a thickness in the range of approximately 10 Å to approximately 500 Å. In representative embodiments including a bi-layer second diffusion barrier layer 108, the Ti layer is disposed by a known method first over the first electrode 204, and the Pt layer is disposed by a known method over the Ti layer, and beneath the piezoelectric layer 207. In accordance with a representative embodiment, the titanium layer has a thickness of approximately 10 Å, and the platinum layer thickness of approximately 500 Å.

In another representative embodiment, the diffusion barrier layer 208 is platinum (Pt). In addition to providing suitable adhesive and diffusive barrier properties, platinum has been found to 'smooth' the upper surface 209 of the piezoelectric layer 207. To this end, Applicants have discovered that the upper surface 209 of the piezoelectric layer 207, which is illustratively ASN, can be comparatively rough. This surface roughness can impact the integrity of the interface between the piezoelectric layer and the electrode disposed thereover in known BAW resonators. This lack of uniformity can result in localized areas of comparatively high electric field strength, which in turn have a deleterious impact on the electric and acoustic performance of the BAW resonator. However, by the present teachings, in a representative embodiment in which the diffusion barrier layer 208 comprises platinum, the smoothing aspect of platinum results in a better/more uniform interface and, ultimately, better electric and acoustic performance of the BAW resonator 211 compared to certain known BAW resonators.

In accordance with a representative embodiment, the second diffusion barrier layer 108 is platinum (Pt). As noted above, in addition to providing suitable adhesive and diffusive barrier properties, platinum has been found to 'smooth' the surface of the piezoelectric layer 107, which in turn fosters better electrical performance of the BAW resonator 100. Without wishing to be bound to theory, this smoothing effect of platinum (Pt) is inferred from its behavior on chemically similar AlGaAs and AlInAs surfaces in III-V high electron mobility (HEMT) technology. In such technology the platinum (Pt) is often used to controllably sink, by sintering, the metal-semiconductor interface to a uniform depth roughly twice that of the deposited platinum (Pt). When applied to the chemically similar piezoelectric material, which is also a III-V material, the required anneal is attendant since BAW fabrication/processing involves comparatively higher temperatures than HEMT processing. As much as any geometrical/physical smoothing, the benefits also include, but are not limited to: (1) very good adhesion; and (2) very clean metal/insulator interface. In certain representative embodiments, and as will be readily apparent to one of ordinary skill in the art, an etching step using a known etchant (e.g., HF) is used, for example, to form the cavity, of the BAW resonator 211. Applicants have found that subjecting the diffusion barrier layers (e.g., diffusion barrier layer 208) to a high temperature anneal will help the materials (e.g., Ti and Pt) become more resilient to attack under HF, and thereby avoid an undercut of these layers during the etching step. Just by way of example, an anneal step at approximately 300° C. to approximately 450° C. may be done by a Rapid Thermal Anneal (RTA), for example for approximately 30s, or on a hotplate (<~2 hrs), or in an oven. During the anneal step, the ambient may be controlled using nitrogen, hydrogen, or argon, for example.

Finally, Applicants note the thicknesses of the layers of titanium (Ti) disclosed herein are also useful in reducing the attack of the titanium during the HF etch that is common in BAW resonator fabrication. Without wishing to be bound to theory, Applicants surmise that the selection of the comparatively thin layers of Ti is useful in essentially tying up as much of the Ti as possible in chemical bonds to its neighbors, so that it loses as much of its bulk properties, which includes high etch rate in HF.

Applicants have discovered that by providing the diffusion barrier layer 208 over the upper surface 209 of the piezoelectric layer 207, the acoustic coupling coefficient ($kt^2$), and its attendant parameters, resistance at parallel resonance (Rp), and resistance at series resonance (Rs) are at least acceptable to the performance requirements of the BAW resonator 211. Similarly, the overall Q of the device is at least acceptable.

Figure 3:
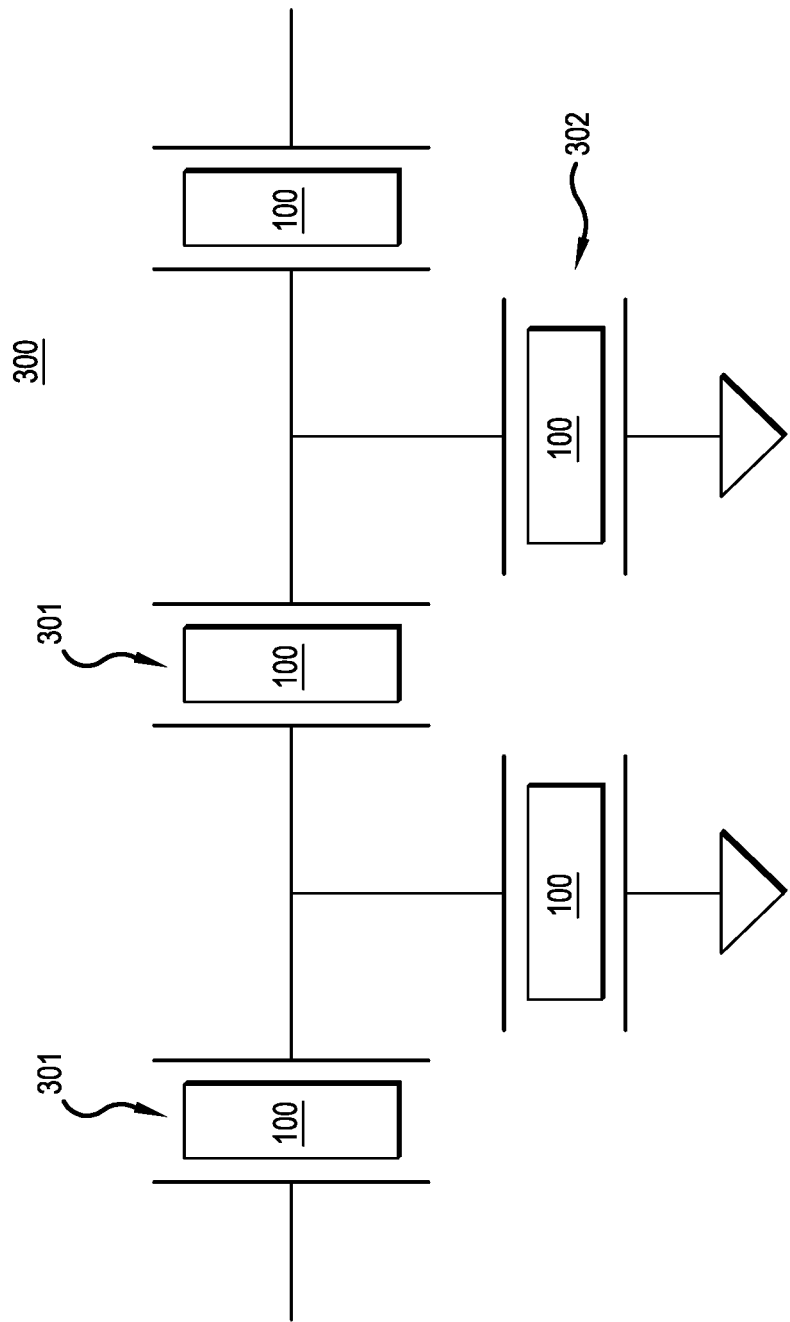
FIG. 3 is a simplified schematic diagram of a filter comprising BAW resonators according to representative embodiments.

When connected in a selected topology, a plurality of BAW resonators 100, 111, 200, 211 can function as an electrical filter. FIG. 3 shows a simplified schematic block diagram of an electrical filter 300 in accordance with a representative embodiment. The electrical filter 300 comprises series BAW resonators 301 and shunt BAW resonators 302. The series BAW resonators 301 and shunt BAW resonators 302 may comprise the BAW resonators 100, 111, 200, 211 described in connection with the representative embodiments of FIGS. 1A-2B. The electrical filter 300 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 300 is merely illustrative and other topologies are contemplated. Moreover, the acoustic resonators of the representative embodiments are contemplated in a variety of applications besides duplexers.

In accordance with representative embodiments, BAW resonators comprising doped piezoelectric layers, a raised frame element, or a recessed frame element, or both, are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
a substrate comprising an acoustic reflector;
a first electrode disposed over the acoustic reflector;
a piezoelectric layer disposed over the first electrode, the piezoelectric layer comprising scandium-doped aluminum nitride (ASN);
a diffusion barrier layer disposed over the piezoelectric layer, the diffusion barrier layer configured to prevent diffusion of material of the first electrode into the piezoelectric layer, wherein the diffusion barrier layer comprises an adhesive component; and
a second electrode disposed over the diffusion barrier layer.

2. The BAW resonator of claim 1, wherein the diffusion barrier layer further comprises a diffusion barrier component.

3. The BAW resonator of claim 2, wherein the adhesive component and the diffusion barrier component are a compound.

4. The BAW resonator of claim 2, wherein the adhesive component and the diffusion barrier component are separate layers.

5. The BAW resonator of claim 3, wherein the adhesive component is titanium (Ti).

6. The BAW resonator of claim 5, wherein the diffusion barrier component comprises one of nitrogen (N), oxygen (O), and tungsten (W).

7. The BAW resonator of claim 1, wherein the diffusion barrier layer is a binary metal layer comprising titanium (Ti) and tungsten (W).

8. The BAW resonator of claim 3, wherein the adhesive component is titanium (Ti).

9. The BAW resonator of claim 8, wherein the diffusion barrier component is platinum (Pt).

10. The BAW resonator of claim 9, wherein the diffusion barrier layer is disposed directly one an upper surface of the piezoelectric layer.

11. The BAW resonator of claim 9, wherein the diffusion barrier layer is disposed directly one an upper surface of the piezoelectric layer.

12. The BAW resonator of claim 1, wherein the scandium-doped aluminum nitride (ASN) has a doping concentration in a range of approximately 3 atomic percent to approximately 40 atomic percent.

13. The BAW resonator of claim 1, wherein the diffusion barrier layer has a thickness in a range of approximately 50 A to approximately 500 A.

14. The BAW resonator of claim 1, wherein the first electrode and the second electrode comprise one of molybdenum (Mo) and tungsten (W).

15. A bulk acoustic wave (BAW) resonator, comprising:
a substrate comprising an acoustic reflector;
a first electrode disposed over the acoustic reflector;
a piezoelectric layer disposed over the first electrode, the piezoelectric layer comprising scandium-doped aluminum nitride (ASN);
a first diffusion barrier layer disposed over the piezoelectric layer, the first diffusion barrier layer configured to prevent diffusion of material of the first electrode into the piezoelectric layer;
a second diffusion barrier layer disposed over the first electrode and beneath the piezoelectric layer; and a second electrode disposed over the second diffusion barrier layer;

wherein the first diffusion barrier layer and the second diffusion barrier layer each comprise an adhesive component.

16. The BAW resonator of claim 15, wherein the first diffusion barrier layer and the second diffusion barrier layer each comprises a diffusion barrier component.

17. The BAW resonator of claim 16, wherein the adhesive component and the diffusion barrier component are a compound.

18. The BAW resonator of claim 16, wherein the adhesive component and the diffusion barrier component are separate layers.

19. The BAW resonator of claim 16, wherein the adhesive component is titanium (Ti).

20. The BAW resonator of claim 19, wherein the diffusion barrier component comprises one of nitrogen (N), oxygen (O), and tungsten (W).

21. The BAW resonator of claim 16, wherein the adhesive component is titanium (Ti).

22. The BAW resonator of claim 21, wherein the diffusion barrier component is platinum (Pt).

23. An electronic device, comprising:
a substrate comprising an acoustic reflector;
a first electrode disposed over the acoustic reflector;
a piezoelectric layer disposed over a side of the first electrode;
a diffusion barrier layer disposed over a side of the piezoelectric layer, the diffusion barrier layer configured to prevent diffusion of material of the first electrode into the piezoelectric layer, wherein the diffusion barrier layer comprises an adhesive component; and
a second electrode.

24. The electronic device of claim 23, wherein the diffusion barrier layer is a binary metal layer comprising titanium (Ti) and tungsten (W).

* * * * *